(12) United States Patent
Van Dam et al.

(10) Patent No.: US 10,809,193 B2
(45) Date of Patent: Oct. 20, 2020

(54) INSPECTION APPARATUS HAVING NON-LINEAR OPTICS

(71) Applicants: ASML Netherlands B.V., Veldhoven (NL); ASML Holding N.V., Veldhoven (NL)

(72) Inventors: Marinus Johannes Maria Van Dam, Venlo (NL); Richard Carl Zimmerman, Brookfield, CT (US)

(73) Assignees: ASML Netherlands B.V., Veldhoven (NL); ASML Holding N.V., Veldhoven (NL)

( * ) Notice: Subject to any disclaimer, the term of this patent is extended or adjusted under 35 U.S.C. 154(b) by 0 days.

(21) Appl. No.: 16/362,922

(22) Filed: Mar. 25, 2019

(65) Prior Publication Data

US 2019/0310190 A1    Oct. 10, 2019

Related U.S. Application Data

(60) Provisional application No. 62/653,786, filed on Apr. 6, 2018.

(51) Int. Cl.
*G01N 21/47* (2006.01)
*G03F 7/20* (2006.01)
*G01N 21/21* (2006.01)

(52) U.S. Cl.
CPC ......... *G01N 21/4788* (2013.01); *G01N 21/21* (2013.01); *G03F 7/7085* (2013.01);
(Continued)

(58) Field of Classification Search
CPC ........... G01N 2021/4792; G01N 21/21; G01N 21/4788; G03F 7/70158; G03F 7/70316; G03F 7/70633; G03F 7/7085
See application file for complete search history.

(56) References Cited

U.S. PATENT DOCUMENTS 4,577,968 A    3/1986 Makosch
5,315,574 A    5/1994 Saimi et al.
(Continued)

FOREIGN PATENT DOCUMENTS

EP    0 243 520 A1    11/1987
EP    0 544 020 A1    6/1993
(Continued)

OTHER PUBLICATIONS

International Search Report and Written Opinion of the International Searching Authority directed to related International Patent Application No. PCT/EP2019/057370, dated Jul. 17, 2019; 9 pages.

*Primary Examiner* — Hina F Ayub
(74) *Attorney, Agent, or Firm* — Sterne, Kessler, Goldstein & Fox P.L.L.C.

(57) ABSTRACT

An inspection apparatus or lithographic apparatus includes an optical system and a detector. The optical system includes a non-linear prismatic optic. The optical system is configured to receive zeroth and first diffraction order beams reflected from a diffraction target and separate first and second polarizations of each diffraction order beam. The detector is configured to simultaneously detect first and second polarizations of each of the zeroth and first diffraction order beams. Based on the detected first and second polarizations of one or more diffraction orders, an operational parameter of a lithographic apparatus can be adjusted to improve accuracy or precision in the lithographic apparatus. The optical system can include a plurality of non-linear prismatic optics. For example, the optical system can include a plurality of Wollaston prisms.

18 Claims, 8 Drawing Sheets

(52) U.S. Cl.
CPC ...... *G03F 7/70158* (2013.01); *G03F 7/70316* (2013.01); *G03F 7/70633* (2013.01); *G01N 2021/4792* (2013.01)

(56) References Cited

U.S. PATENT DOCUMENTS

| | | | |
|---|---|---|---|
| 5,392,116 | A | 2/1995 | Makosch |
| 5,550,798 | A * | 8/1996 | Hineno ................ G11B 7/1356 369/110.04 |
| 6,212,152 | B1 | 4/2001 | Aoyama et al. |
| 6,487,022 | B1 | 11/2002 | Okorogu |
| 6,710,876 | B1 | 3/2004 | Nikoonahad et al. |
| 6,768,543 | B1 | 7/2004 | Aiyer |
| 7,327,464 | B2 | 2/2008 | Hwang et al. |
| 7,511,799 | B2 | 3/2009 | Tel et al. |
| 7,777,895 | B2 | 8/2010 | Medower et al. |
| 8,830,447 | B2 | 9/2014 | Den Boef et al. |
| 8,842,293 | B2 | 9/2014 | Den Boef et al. |
| 8,896,832 | B2 | 11/2014 | Hill et al. |
| 9,606,069 | B2 | 3/2017 | Nesbitt |
| 9,638,635 | B2 | 5/2017 | Acher et al. |
| 9,689,987 | B1 * | 6/2017 | Jannson .................. G01S 17/18 |
| 9,709,441 | B2 | 7/2017 | Acher et al. |
| 9,778,025 | B2 | 10/2017 | Mathijssen et al. |
| 10,379,445 | B2 | 8/2019 | Jak et al. |
| 2004/0213135 | A1 | 10/2004 | Mori et al. |
| 2006/0269218 | A1 * | 11/2006 | Hasegawa ............ G11B 7/1387 385/147 |
| 2013/0162996 | A1 | 6/2013 | Straaijer et al. |
| 2013/0176547 | A1 | 7/2013 | Van De Kerkhof et al. |
| 2015/0070673 | A1 * | 3/2015 | Lalovic ............... G03F 7/70041 355/67 |

FOREIGN PATENT DOCUMENTS

| | | |
|---|---|---|
| EP | 1 628 164 A2 | 2/2006 |
| GB | 1431788 | 4/1976 |
| TW | 201042404 A | 12/2010 |
| TW | 201732224 A | 9/2017 |
| WO | WO 2016/005167 A1 | 1/2016 |
| WO | WO 2017/044283 A1 | 3/2017 |

* cited by examiner

INSPECTION APPARATUS HAVING NON-LINEAR OPTICS

CROSS-REFERENCE TO RELATED APPLICATIONS

This application claims benefit of U.S. provisional application 62/653,786, filed Apr. 6, 2018, which is incorporated by reference in its entirety.

FIELD

The present disclosure relates to an optical system for inspection apparatuses, for example, an inspection apparatuses for lithography apparatuses and systems.

BACKGROUND

A lithographic apparatus is a machine that applies a desired pattern onto a substrate, usually onto a target portion of the substrate. A lithographic apparatus may be used, for example, in the manufacture of integrated circuits (ICs). In that instance, a patterning device, which is alternatively referred to as a mask or a reticle, may be used to generate a circuit pattern to be formed on an individual layer of the IC. This pattern can be transferred onto a target portion (e.g., comprising part of, one, or several dies) on a substrate (e.g., a silicon wafer). Transfer of the pattern is typically via imaging onto a layer of radiation-sensitive material (resist) provided on the substrate. In general, a single substrate will contain a network of adjacent target portions that are successively patterned. Known lithographic apparatus include so-called steppers, in which each target portion is irradiated by exposing an entire pattern onto the target portion at one time, and so-called scanners, in which each target portion is irradiated by scanning the pattern through a radiation beam in a given direction (the "scanning"-direction) while synchronously scanning the target portions parallel or anti-parallel to this scanning direction. It is also possible to transfer the pattern from the patterning device to the substrate by imprinting the pattern onto the substrate.

In order to monitor the lithographic process, parameters of the patterned substrate are measured. Parameters may include, for example, the overlay error between successive layers formed in or on the patterned substrate and critical linewidth of developed photosensitive resist. This measurement may be performed on a product substrate and/or on a dedicated metrology target. There are various techniques for making measurements of the microscopic structures formed in lithographic processes, including the use of scanning electron microscopes and various specialized tools. A fast and non-invasive form of a specialized inspection tool is a scatterometer in which a beam of radiation is directed onto a target on the surface of the substrate and properties of the scattered or reflected beam are measured. By comparing the properties of the beam before and after it has been reflected or scattered by the substrate, the properties of the substrate can be determined. This can be done, for example, by comparing the reflected beam with data stored in a library of known measurements associated with known substrate properties. Spectroscopic scatterometers direct a broadband radiation beam onto the substrate and measure the spectrum (intensity as a function of wavelength) of the radiation scattered into a particular narrow angular range. By contrast, angularly resolved scatterometers use a monochromatic radiation beam and measure the intensity of the scattered radiation as a function of angle.

Such optical scatterometers may be used to measure parameters, such as critical dimensions of developed photosensitive resist or overlay error (OV) between two layers formed in or on the patterned substrate. Properties of the substrate can be determined by comparing the properties of an illumination beam before and after the beam has been reflected or scattered by the substrate.

Fabrication tolerances continue to tighten as semiconductor devices become ever smaller and more elaborate. Hence, there is a need to continue to improve metrology measurements. One exemplary use of scatterometers is for critical dimension (CD) metrology, which is particularly useful for measuring in patterned structures, such as semiconductor wafers. Optical CD metrology techniques include on dome scatterometry, spectral reflectometry, and spectral ellipsometry. All these techniques are based on measuring the reflected intensity of differently polarized light for different incident directions. Such techniques require a high extinction ratio or purity of polarization. A polarizing beamsplitter (PBS) divides light by polarization state to transmit p-polarized light while reflecting s-polarized light. Though a perfect PBS transmits 100% of the p-polarization and reflects 100% s-polarization, a real PBS transmits and reflects mixtures of s-polarized light and p-polarized light. The ratio between the p-polarized light and s-polarized light is called the extinction ratio. Optical CD requires a high extinction ratio.

Another exemplary use of scatterometers is for overlay (OV) metrology, which is useful for measuring alignment of a stack of layers on a wafer. In order to control the lithographic process to place device features accurately on the substrate, alignment marks, or targets, are generally provided on the substrate, and the lithographic apparatus includes one or more alignment systems by which positions of marks on a substrate must be measured accurately. In one known technique, the scatterometer measures diffracted light from targets on the wafer. Diffraction-based overlay using "dark field" scatterometry blocks the zeroth order of diffraction (corresponding to a specular reflection), and processes only one or more higher orders of diffraction to create a gray scale image of the target. Diffraction-based overlay using this dark field technique can enable overlay measurements on smaller targets and is known as micro-diffraction-based overlay (μDBO). μDBO, however, can require a very high contrast ratio.

Each product and process requires care in the design of metrology targets and the selection of an appropriate metrology "recipe" by which overlay measurements will be performed. Some metrology techniques capture diffraction patterns and/or dark field images of a metrology target while the target is illuminated under desired illumination conditions. These illumination conditions can be defined in the metrology recipe by various illumination parameters such as the wavelength of the radiation, angular intensity distribution (illumination profile), and polarization.

SUMMARY

In some embodiments, an inspection apparatus includes an optical system and a detector. In some embodiments, the optical system includes a non-linear prismatic optic. In some embodiments, the optical system is configured to receive zeroth and first diffraction order beams reflected from a diffraction target. In some embodiments, the optical system is configured to separate first and second polarizations of each diffraction order beam. In some embodiments, the detector is configured to simultaneously detect first and second polarizations of each of the zeroth and first diffraction order beams.

In some embodiments, the optical system is at a pupil plane of the inspection apparatus. In some embodiments, the non-linear prismatic optic is birefringent. In some embodiments, the non-linear prismatic optic is configured to separate ordinary and extraordinary rays from each of the zeroth and first diffraction order beams. In some embodiments, the first polarization of each of the zeroth and first diffraction order beams is a horizontal polarization component, and the second polarization of each of the zeroth and first diffraction order beams is a vertical polarization component, orthogonal to the horizontal polarization component.

In some embodiments, the optical system further includes a plurality of non-linear prismatic optics. In some embodiments, the plurality of non-linear prismatic optics includes a plurality of Wollaston prisms. In some embodiments, the plurality of Wollaston prisms includes a first type and a second type. In some embodiments, the plurality of Wollaston prisms includes two first-type Wollaston prisms each having a first wedge angle and corresponding first divergence angle. For example, the first wedge angle and corresponding first divergence angle can be 45°. In some embodiments, the plurality of Wollaston prisms includes two second-type Wollaston prisms each having a second wedge angle and corresponding second divergence angle. For example, the second wedge angle and corresponding second divergence angle can be 15°. In some embodiments, the first wedge angle and first divergence angle are greater than the second wedge angle and second divergence angle. In some embodiments, the two first-type Wollaston prisms are rotated 90° with respect to each other. In some embodiments, the two second-type Wollaston prisms are rotated 90° with respect to each other.

In some embodiments, a lithographic apparatus for measuring micro-diffraction-based overlay includes a first illumination optical system, a projection optical system, and a scatterometer. In some embodiments, the first illumination optical system is configured to illuminate a diffraction pattern. In some embodiments, the projection optical system is configured to project an image of the diffraction pattern onto a substrate. In some embodiments, the scatterometer is configured to determine a parameter of the lithographic apparatus.

In some embodiments, the scatterometer includes a second illumination optical system, an objective optical system, and an inspection apparatus. In some embodiments, the second illumination optical system is configured to deliver at least one beam of radiation. In some embodiments, the objective optical system is configured to focus the at least one beam of radiation onto the substrate. In some embodiments, the inspection apparatus is configured to detect a reflected radiation beam from the substrate.

In some embodiments, the inspection apparatus of the scatterometer includes an optical system and a detector. In some embodiments, the optical system includes a non-linear prismatic optic. In some embodiments, the optical system is configured to receive zeroth and first diffraction order beams reflected from the diffraction target and separate first and second polarizations of each diffraction order beam. In some embodiments, the detector is configured to simultaneously detect first and second polarizations of each of the zeroth and first diffraction order beams.

In some embodiments, the non-linear prismatic optic is a birefringent optical element, a Wollaston prism, a Nomarski prism, a Sénarmont prism, a Rochon prism, a Glan-Thompson prism, or a Glan-Foucault prism. In some embodiments, the optical system includes a neutral density filter. In some embodiments, the neutral density filter is configured to normalize an intensity of a zeroth diffraction order relative to an intensity of a first diffraction order. In some embodiments, the optical system is at a pupil plane of the inspection apparatus, and the detector is a single dark field detector. In some embodiments, the first polarization of each of the zeroth and first diffraction order beams is a horizontal polarization component, and the second polarization of each of the zeroth and first diffraction order beams is a vertical polarization component, orthogonal to the horizontal polarization component.

In some embodiments, the optical system further includes a plurality of non-linear prismatic optics. In some embodiments, the plurality of non-linear prismatic optics includes a plurality of Wollaston prisms. In some embodiments, the plurality of Wollaston prisms includes a first type and a second type.

In some embodiments, the plurality of Wollaston prisms includes two first-type Wollaston prisms each having a first wedge angle and corresponding first divergence angle. For example, the first wedge angle and corresponding first divergence angle can be 45°. In some embodiments, the plurality of Wollaston prisms includes two second-type Wollaston prisms each having a second wedge angle and corresponding second divergence angle. For example, the second wedge angle and corresponding second divergence angle can be 15°. In some embodiments, the first wedge angle and first divergence angle are greater than the second wedge angle and second divergence angle. In some embodiments, the two first-type Wollaston prisms are rotated 90° with respect to each other. In some embodiments, the two second-type Wollaston prisms are rotated 90° with respect to each other.

In some embodiments, the plurality of Wollaston prisms are arranged on a transparent plate in a 2×2 matrix array. In some embodiments, the plurality of Wollaston prisms are configured to separately receive first and second zeroth diffraction order sub-beams and first and second first diffraction order sub-beams.

In some embodiments, a horizontal polarization component and a vertical polarization component, orthogonal to the horizontal polarization component, are separated for each of the first and second zeroth diffraction order sub-beams and the first and second first diffraction order sub-beams by the corresponding plurality of Wollaston prisms. In some embodiments, the horizontal polarization component and a vertical polarization component of each sub-beam are imaged by the detector as eight discrete beam spots.

In some embodiments, a method for measuring micro-diffraction-based overlay includes separating, by an optical system including a non-linear prismatic optic, first and second polarizations of both zeroth and first diffraction order beams reflected from a diffraction target. In some embodiments, the method includes detecting simultaneously, by a detector, zeroth and first diffraction orders and first and second polarizations of each diffraction order. In some embodiments, the method includes adjusting a parameter of interest of the diffraction target to improve accuracy or precision in a metrology or lithography system. In some embodiments, the method includes adjusting or optimizing a parameter of a lithographic apparatus based on the detected first and second polarizations of one or more diffraction orders to improve accuracy, precision, timing, efficiency, and/or productivity of the lithographic apparatus. In some embodiments, the method includes adjusting an operational parameter of a lithographic apparatus based on the detected first and second polarizations of one or more diffraction orders to improve accuracy or precision in the lithographic apparatus.

In some embodiments, the method includes separating individually first and second zeroth diffraction order sub-beams and first and second first diffraction order sub-beams. In some embodiments, the method includes isolating a horizontal polarization component and a vertical polarization component, orthogonal to the horizontal polarization component, for each of the first and second zeroth diffraction order sub-beams and first and second first diffraction order sub-beams. In some embodiments, the method includes imaging the horizontal and vertical polarization components of each zeroth and first diffraction order sub-beams on a single dark field detector as eight discrete beam spots.

Further features and advantages of the invention, as well as the structure and operation of various embodiments of the invention, are described in detail below with reference to the accompanying drawings. It is noted that the invention is not limited to the specific embodiments described herein. Such embodiments are presented herein for illustrative purposes only. Additional embodiments will be apparent to persons skilled in the relevant art(s) based on the teachings contained herein.

BRIEF DESCRIPTION OF THE DRAWINGS/FIGURES

The accompanying drawings, which are incorporated herein and form part of the specification, illustrate the present invention and, together with the description, further serve to explain the principles of the invention and to enable a person skilled in the relevant art(s) to make and use the invention.

Figure 1A:
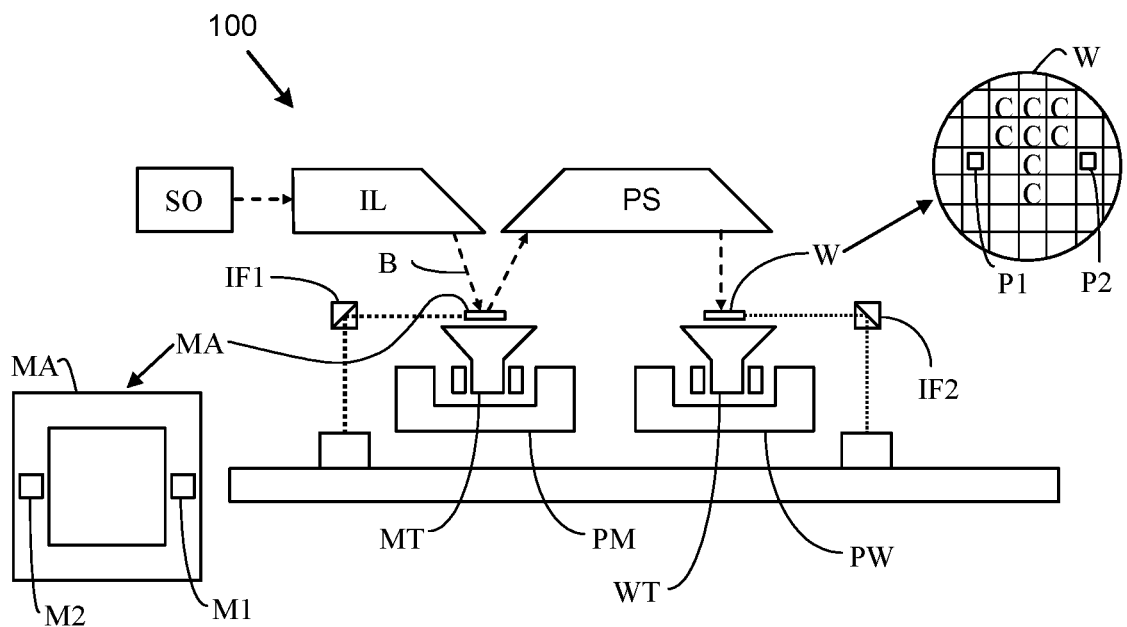
FIG. 1A is a schematic illustration of a reflective lithographic apparatus, according to an exemplary embodiment.

The features and advantages of the present invention will become more apparent from the detailed description set forth below when taken in conjunction with the drawings, in which like reference characters identify corresponding elements throughout. In the drawings, like reference numbers generally indicate identical, functionally similar, and/or structurally similar elements. Additionally, generally, the left-most digit(s) of a reference number identifies the drawing in which the reference number first appears. Unless otherwise indicated, the drawings provided throughout the disclosure should not be interpreted as to-scale drawings.

DETAILED DESCRIPTION

This specification discloses one or more embodiments that incorporate the features of this invention. The disclosed embodiment(s) merely exemplify the invention. The scope of the invention is not limited to the disclosed embodiment(s). The invention is defined by the claims appended hereto.

The embodiment(s) described, and references in the specification to "one embodiment," "an embodiment," "an example embodiment," etc., indicate that the embodiment(s) described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is understood that it is within the knowledge of one skilled in the art to effect such feature, structure, or characteristic in connection with other embodiments whether or not explicitly described.

Spatially relative terms, such as "beneath," "below," "lower," "above," "on," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations), and the spatially relative descriptors used herein may likewise be interpreted accordingly.

The term "about" as used herein indicates the value of a given quantity that can vary based on a particular technology. Based on the particular technology, the term "about" can indicate a value of a given quantity that varies within, for example, 10-30% of the value (e.g., ±10%, ±20%, or ±30% of the value).

Embodiments of the disclosure may be implemented in hardware, firmware, software, or any combination thereof. Embodiments of the disclosure may also be implemented as instructions stored on a machine-readable medium, which may be read and executed by one or more processors. A machine-readable medium may include any mechanism for storing or transmitting information in a form readable by a machine (e.g., a computing device). For example, a machine-readable medium may include read only memory (ROM); random access memory (RAM); magnetic disk storage media; optical storage media; flash memory devices; electrical, optical, acoustical or other forms of propagated signals (e.g., carrier waves, infrared signals, digital signals, etc.), and others. Further, firmware, software, routines, and/or instructions may be described herein as performing certain actions. However, it should be appreciated that such descriptions are merely for convenience and that such actions, in fact, result from computing devices, processors, controllers, or other devices executing the firmware, software, routines, instructions, etc.

Before describing such embodiments in more detail, however, it is instructive to present an example environment in which embodiments of the present disclosure may be implemented.

Example Lithographic Systems

Figure 1B:
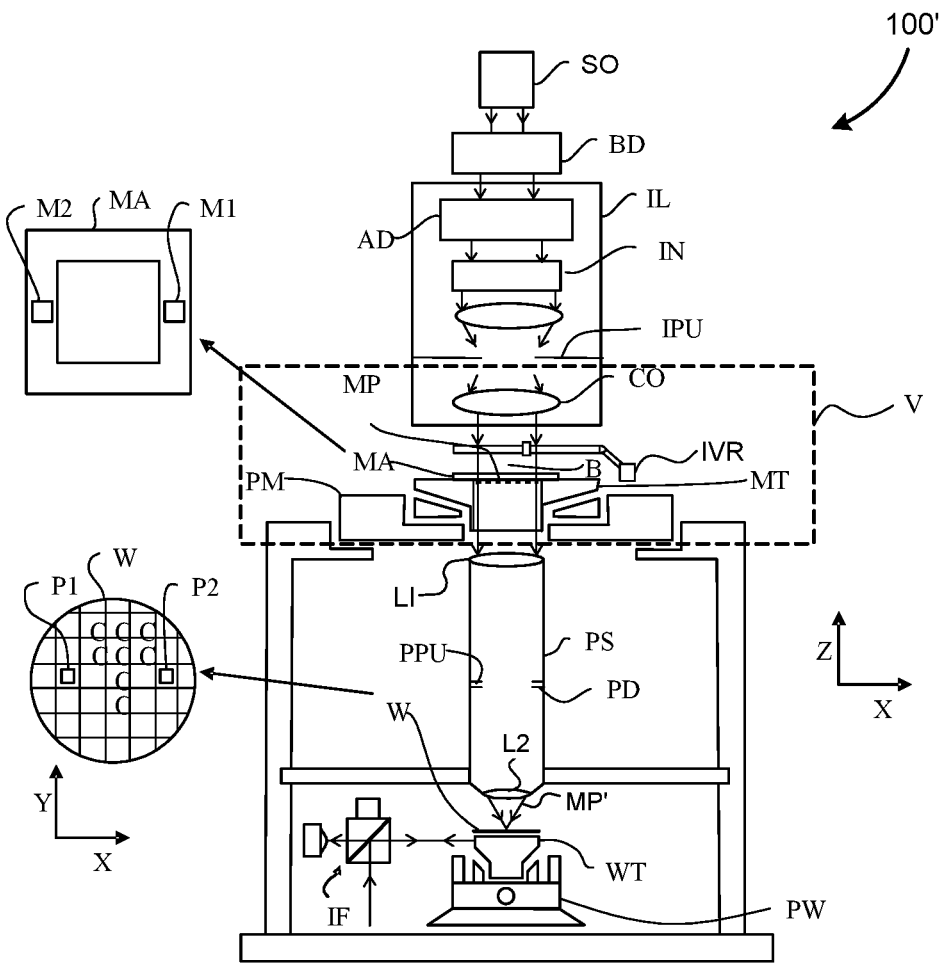
FIG. 1B is a schematic illustration of a transmissive lithographic apparatus, according to an exemplary embodiment.

FIGS. 1A and 1B are schematic illustrations of a lithographic apparatus 100 and lithographic apparatus 100', respectively, in which embodiments of the present invention may be implemented. Lithographic apparatus 100 and lithographic apparatus 100' each include the following: an illumination system (illuminator) IL configured to condition a radiation beam B (for example, deep ultra violet or extreme ultra violet radiation); a support structure (for example, a mask table) MT configured to support a patterning device (for example, a mask, a reticle, or a dynamic patterning device) MA and connected to a first positioner PM configured to accurately position the patterning device MA; and, a substrate table (for example, a wafer table) WT configured to hold a substrate (for example, a resist coated wafer) W and connected to a second positioner PW configured to accurately position the substrate W. Lithographic apparatus 100 and 100' also have a projection system PS configured to project a pattern imparted to the radiation beam B by patterning device MA onto a target portion (for example, comprising one or more dies) C of the substrate W. In lithographic apparatus 100, the patterning device MA and the projection system PS are reflective. In lithographic apparatus 100', the patterning device MA and the projection system PS are transmissive.

The illumination system IL may include various types of optical components, such as refractive, reflective, catadioptric, magnetic, electromagnetic, electrostatic, or other types of optical components, or any combination thereof, for directing, shaping, or controlling the radiation beam B.

The support structure MT holds the patterning device MA in a manner that depends on the orientation of the patterning device MA with respect to a reference frame, the design of at least one of the lithographic apparatus 100 and 100', and other conditions, such as whether or not the patterning device MA is held in a vacuum environment. The support structure MT may use mechanical, vacuum, electrostatic, or other clamping techniques to hold the patterning device MA. The support structure MT can be a frame or a table, for example, which can be fixed or movable, as required. By using sensors, the support structure MT can ensure that the patterning device MA is at a desired position, for example, with respect to the projection system PS.

The term "patterning device" MA should be broadly interpreted as referring to any device that can be used to impart a radiation beam B with a pattern in its cross-section, such as to create a pattern in the target portion C of the substrate W. The pattern imparted to the radiation beam B can correspond to a particular functional layer in a device being created in the target portion C to form an integrated circuit.

The patterning device MA may be transmissive (as in lithographic apparatus 100' of FIG. 1B) or reflective (as in lithographic apparatus 100 of FIG. 1A). Examples of patterning devices MA include reticles, masks, programmable mirror arrays, or programmable LCD panels. Masks are well known in lithography and include mask types such as binary, alternating phase shift, or attenuated phase shift, as well as various hybrid mask types. An example of a programmable mirror array employs a matrix arrangement of small mirrors, each of which can be individually tilted so as to reflect an incoming radiation beam in different directions. The tilted mirrors impart a pattern in the radiation beam B which is reflected by a matrix of small mirrors.

The term "projection system" PS can encompass any type of projection system, including refractive, reflective, catadioptric, magnetic, electromagnetic and electrostatic optical systems, or any combination thereof, as appropriate for the exposure radiation being used, or for other factors, such as the use of an immersion liquid on the substrate W or the use of a vacuum. A vacuum environment can be used for EUV or electron beam radiation since other gases can absorb too much radiation or electrons. A vacuum environment can, therefore, be provided to the whole beam path with the aid of a vacuum wall and vacuum pumps.

Lithographic apparatus 100 and/or lithographic apparatus 100' can be of a type having two (dual stage) or more substrate tables WT (and/or two or more mask tables). In such "multiple stage" machines, the additional substrate tables WT can be used in parallel, or preparatory steps can be carried out on one or more tables while one or more other substrate tables WT are being used for exposure. In some situations, the additional table may not be a substrate table WT.

The lithographic apparatus may also be of a type wherein at least a portion of the substrate may be covered by a liquid having a relatively high refractive index, e.g., water, so as to fill a space between the projection system and the substrate. An immersion liquid may also be applied to other spaces in the lithographic apparatus, for example, between the mask and the projection system. Immersion techniques are well known in the art for increasing the numerical aperture of projection systems. The term "immersion" as used herein does not mean that a structure, such as a substrate, must be submerged in liquid, but rather only means that liquid is located between the projection system and the substrate during exposure.

Referring to FIGS. 1A and 1B, the illuminator IL receives a radiation beam from a radiation source SO. The source SO and the lithographic apparatus 100, 100' can be separate physical entities, for example, when the source SO is an excimer laser. In such cases, the source SO is not considered to form part of the lithographic apparatus 100 or 100', and the radiation beam B passes from the source SO to the illuminator IL with the aid of a beam delivery system BD (in FIG. 1B) including, for example, suitable directing mirrors and/or a beam expander. In other cases, the source SO can be an integral part of the lithographic apparatus 100, 100', for example, when the source SO is a mercury lamp. The source SO and the illuminator IL, together with the beam delivery system BD, if required, can be referred to as a radiation system.

The illuminator IL can include an adjuster AD (in FIG. 1B) for adjusting the angular intensity distribution of the radiation beam. Generally, at least the outer and/or inner radial extent (commonly referred to as "σ-outer" and "σ-inner," respectively) of the intensity distribution in a pupil plane of the illuminator can be adjusted. In addition, the illuminator IL can comprise various other components (in FIG. 1B), such as an integrator IN and a condenser CO. The illuminator IL can be used to condition the radiation beam B to have a desired uniformity and intensity distribution in its cross section.

Referring to FIG. 1A, the radiation beam B is incident on the patterning device (for example, mask) MA, which is held on the support structure (for example, mask table) MT, and is patterned by the patterning device MA. In lithographic apparatus 100, the radiation beam B is reflected from the patterning device (for example, mask) MA. After being reflected from the patterning device (for example, mask) MA, the radiation beam B passes through the projection system PS, which focuses the radiation beam B onto a target portion C of the substrate W. With the aid of the second positioner PW and position sensor IF2 (for example, an interferometric device, linear encoder, or capacitive sensor), the substrate table WT can be moved accurately (for example, so as to position different target portions C in the path of the radiation beam B). Similarly, the first positioner PM and another position sensor IF1 can be used to accurately position the patterning device (for example, mask) MA with respect to the path of the radiation beam B. Patterning device (for example, mask) MA and substrate W can be aligned using mask alignment marks M1, M2 and substrate alignment marks P1, P2.

Referring to FIG. 1B, the radiation beam B is incident on the patterning device (for example, mask MA), which is held on the support structure (for example, mask table MT), and is patterned by the patterning device. Having traversed the mask MA, the radiation beam B passes through the projection system PS, which focuses the beam onto a target portion C of the substrate W. The projection system has a pupil conjugate PPU to an illumination system pupil IPU. Portions of radiation emanate from the intensity distribution at the illumination system pupil IPU and traverse a mask pattern without being affected by diffraction at the mask pattern and create an image of the intensity distribution at the illumination system pupil IPU.

The projection system PS projects an image MP' of the mask pattern MP, where image MP' is formed by diffracted beams produced from the mark pattern MP by radiation from the intensity distribution, onto a photoresist layer coated on the substrate W. For example, the mask pattern MP may include an array of lines and spaces. A diffraction of radiation at the array and different from zeroth order diffraction generates diverted diffracted beams with a change of direction in a direction perpendicular to the lines. Undiffracted beams (i.e., so-called zeroth order diffracted beams) traverse the pattern without any change in propagation direction. The zeroth order diffracted beams traverse an upper lens or upper lens group of the projection system PS, upstream of the pupil conjugate PPU of the projection system PS, to reach the pupil conjugate PPU. The portion of the intensity distribution in the plane of the pupil conjugate PPU and associated with the zeroth order diffracted beams is an image of the intensity distribution in the illumination system pupil IPU of the illumination system IL. The aperture device PD, for example, is disposed at or substantially at a plane that includes the pupil conjugate PPU of the projection system PS.

The projection system PS is arranged to capture, by means of an upper lens or upper lens group L1 and a lower lens or lower lens group L2, not only the zeroth order diffracted beams, but also first-order or first- and higher-order diffracted beams (not shown). In some embodiments, dipole illumination for imaging line patterns extending in a direction perpendicular to a line may be used to utilize the resolution enhancement effect of dipole illumination. For example, first-order diffracted beams interfere with corresponding zeroth-order diffracted beams at the level of the wafer W to create an image MP' of the line pattern MP at the highest possible resolution and process window (i.e., usable depth of focus in combination with tolerable exposure dose deviations). In some embodiments, astigmatism aberration may be reduced by providing radiation poles (not shown) in opposite quadrants of the illumination system pupil IPU. For example, the illumination at the illumination system pupil IPU may use only two opposite illumination quadrants, sometimes referred to as BMW illumination, such that the remaining two quadrants are not used in the illumination but are configured to capture first-order diffracted beams. Further, in some embodiments, astigmatism aberration may be reduced by blocking the zeroth order beams in the pupil conjugate PPU of the projection system associated with radiation poles in opposite quadrants. This is described in more detail in U.S. Pat. No. 7,511,799 B2, issued Mar. 31, 2009, which is incorporated by reference herein in its entirety.

With the aid of the second positioner PW and position sensor IF (for example, an interferometric device, linear encoder, or capacitive sensor), the substrate table WT can be moved accurately (for example, so as to position different target portions C in the path of the radiation beam B). Similarly, the first positioner PM and another position sensor (not shown in FIG. 1B) can be used to accurately position the mask MA with respect to the path of the radiation beam B (for example, after mechanical retrieval from a mask library or during a scan).

In general, movement of the mask table MT can be realized with the aid of a long-stroke module (coarse positioning) and a short-stroke module (fine positioning), which form part of the first positioner PM. Similarly, movement of the substrate table WT can be realized using a long-stroke module and a short-stroke module, which form part of the second positioner PW. In the case of a stepper (as opposed to a scanner), the mask table MT can be connected to a short-stroke actuator only or can be fixed. Mask MA and substrate W can be aligned using mask alignment marks M1, M2, and substrate alignment marks P1, P2. Although the substrate alignment marks (as illustrated) occupy dedicated target portions, they can be located in spaces between target portions (known as scribe-lane alignment marks). Similarly, in situations in which more than one die is provided on the mask MA, the mask alignment marks can be located between the dies.

Mask table MT and patterning device MA can be in a vacuum chamber V, where an in-vacuum robot IVR can be used to move patterning devices such as a mask in and out of vacuum chamber. Alternatively, when mask table MT and patterning device MA are outside of the vacuum chamber, an out-of-vacuum robot can be used for various transportation operations, similar to the in-vacuum robot IVR. Both the in-vacuum and out-of-vacuum robots need to be calibrated for a smooth transfer of any payload (e.g., mask) to a fixed kinematic mount of a transfer station.

The lithographic apparatus 100 and 100' can be used in at least one of the following modes:

1. In step mode, the support structure (for example, mask table) MT and the substrate table WT are kept essentially stationary, while an entire pattern imparted to the radiation beam B is projected onto a target portion C at one time (i.e., a single static exposure). The substrate table WT is then shifted in the X and/or Y direction so that a different target portion C can be exposed.

2. In scan mode, the support structure (for example, mask table) MT and the substrate table WT are scanned synchronously while a pattern imparted to the radiation beam B is projected onto a target portion C (i.e., a single dynamic exposure). The velocity and direction of the substrate table WT relative to the support structure (for example, mask table) MT can be determined by the (de-)magnification and image reversal characteristics of the projection system PS.

3. In another mode, the support structure (for example, mask table) MT is kept substantially stationary holding a programmable patterning device, and the substrate table WT is moved or scanned while a pattern imparted to the radiation beam B is projected onto a target portion C. A pulsed radiation source SO can be employed and the programmable patterning device is updated as required after each movement of the substrate table WT or in between successive radiation pulses during a scan. This mode of operation can be readily applied to maskless lithography that utilizes a programmable patterning device, such as a programmable mirror array.

Combinations and/or variations on the described modes of use or entirely different modes of use can also be employed.

In a further embodiment, lithographic apparatus 100 includes an extreme ultraviolet (EUV) source, which is configured to generate a beam of EUV radiation for EUV lithography. In general, the EUV source is configured in a radiation system, and a corresponding illumination system is configured to condition the EUV radiation beam of the EUV source.

Figure 2:
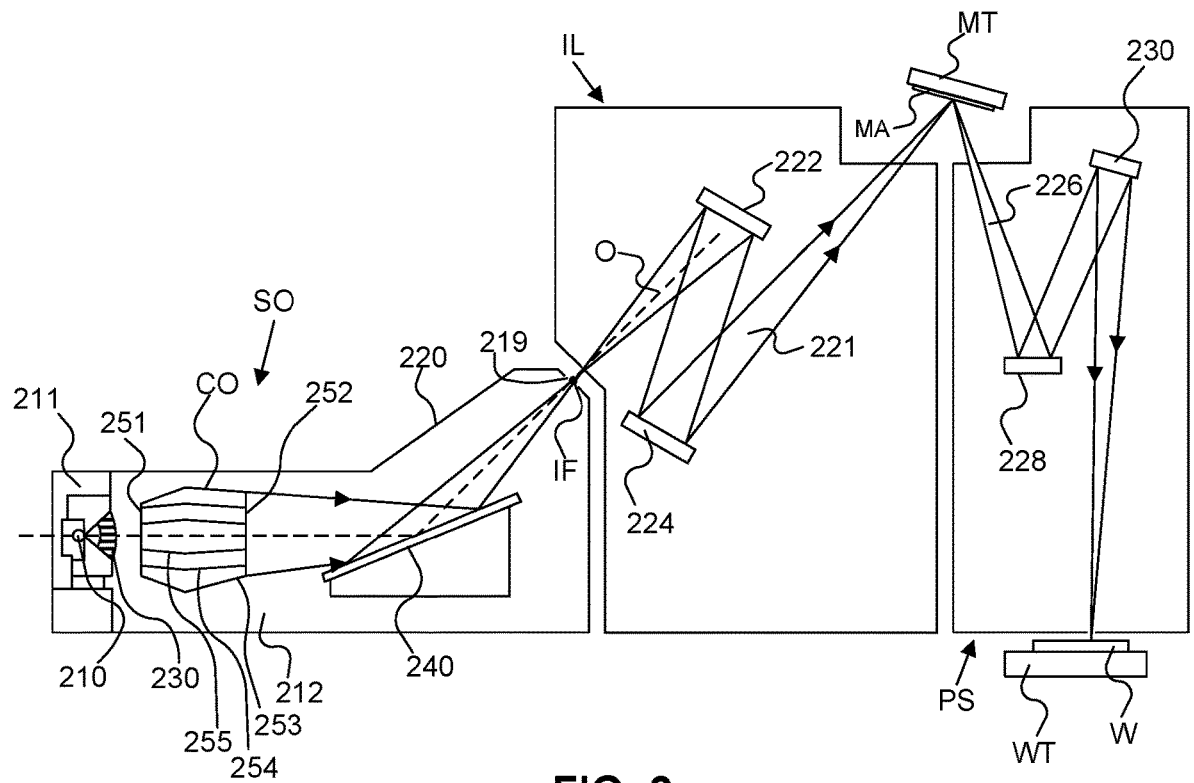
FIG. 2 is a more detailed schematic illustration of the reflective lithographic apparatus, according to an exemplary embodiment.

FIG. 2 shows the lithographic apparatus 100 in more detail, including the source collector apparatus SO, the illumination system IL, and the projection system PS. The source collector apparatus SO is constructed and arranged such that a vacuum environment can be maintained in an enclosing structure 220 of the source collector apparatus SO. An EUV radiation emitting plasma 210 may be formed by a discharge produced plasma source. EUV radiation may be produced by a gas or vapor, for example, Xe gas, Li vapor, or Sn vapor in which the very hot plasma 210 is created to emit radiation in the EUV range of the electromagnetic spectrum. The very hot plasma 210 is created by, for example, an electrical discharge causing at least a partially ionized plasma. Partial pressures of, for example, 10 Pa of Xe, Li, Sn vapor, or any other suitable gas or vapor may be required for efficient generation of the radiation. In an embodiment, a plasma of excited tin (Sn) is provided to produce EUV radiation.

The radiation emitted by the hot plasma 210 is passed from a source chamber 211 into a collector chamber 212 via an optional gas barrier or contaminant trap 230 (in some cases also referred to as contaminant barrier or foil trap) which is positioned in or behind an opening in source chamber 211. The contaminant trap 230 may include a channel structure. Contamination trap 230 may also include a gas barrier or a combination of a gas barrier and a channel structure. The contaminant trap or contaminant barrier 230 further indicated herein at least includes a channel structure.

The collector chamber 212 may include a radiation collector CO which may be a so-called grazing incidence collector. Radiation collector CO has an upstream radiation collector side 251 and a downstream radiation collector side 252. Radiation that traverses collector CO can be reflected off a grating spectral filter 240 to be focused in a virtual source point IF. The virtual source point IF is commonly referred to as the intermediate focus and the source collector apparatus is arranged such that the intermediate focus IF is located at or near an opening 219 in the enclosing structure 220. The virtual source point IF is an image of the radiation emitting plasma 210. Grating spectral filter 240 is used in particular for suppressing infra-red (IR) radiation.

Subsequently, the radiation traverses the illumination system IL, which may include a faceted field mirror device 222 and a faceted pupil mirror device 224 arranged to provide a desired angular distribution of the radiation beam 221, at the patterning device MA, as well as a desired uniformity of radiation intensity at the patterning device MA. Upon reflection of the beam of radiation 221 at the patterning device MA, held by the support structure MT, a patterned beam 226 is formed, and the patterned beam 226 is imaged by the projection system PS via reflective elements 228, 230 onto a substrate W held by the wafer stage or substrate table WT.

More elements than shown may generally be present in illumination optics unit IL and projection system PS. The grating spectral filter 240 may optionally be present, depending upon the type of lithographic apparatus. Further, there may be more mirrors present than those shown in the FIG. 2, for example, there may be one to six additional reflective elements present in the projection system PS than shown in FIG. 2.

Collector optic CO, as illustrated in FIG. 2, is depicted as a nested collector with grazing incidence reflectors 253, 254, and 255, just as an example of a collector (or collector mirror). The grazing incidence reflectors 253, 254, and 255 are disposed axially symmetric around an optical axis O, and a collector optic CO of this type is preferably used in combination with a discharge produced plasma source, often called a DPP source.

Exemplary Lithographic Cell

Figure 3:
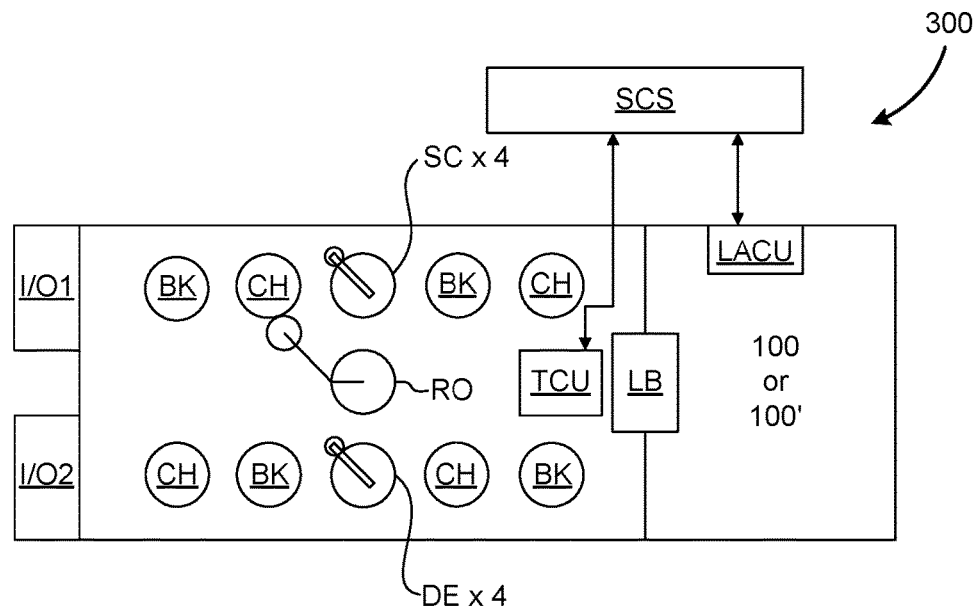
FIG. 3 is a schematic illustration of a lithographic cell, according to an exemplary embodiment.

FIG. 3 shows a lithographic cell 300, also sometimes referred to a lithocell or cluster. Lithographic apparatus 100 or 100' may form part of lithographic cell 300. Lithographic cell 300 may also include one or more apparatuses to perform pre- and post-exposure processes on a substrate. Conventionally these include spin coaters SC to deposit resist layers, developers DE to develop exposed resist, chill plates CH, and bake plates BK. A substrate handler, or robot, RO picks up substrates from input/output ports I/O1, I/O2, moves them between the different process apparatuses and delivers them to the loading bay LB of the lithographic apparatus 100 or 100'. These devices, which are often collectively referred to as the track, are under the control of a track control unit TCU which is itself controlled by a supervisory control system SCS, which also controls the lithographic apparatus via lithography control unit LACU. Thus, the different apparatuses can be operated to maximize throughput and processing efficiency.

Exemplary Scatterometers

In order to ensure that the substrates that are exposed by a lithographic apparatus, such as lithographic apparatus 100 and/or 100', are exposed correctly and consistently, it is desirable to inspect exposed substrates to measure properties such as overlay errors between subsequent layers, line thicknesses, critical dimensions (CD), etc. If errors are detected, adjustments may be made to exposures of subsequent substrates, especially if the inspection can be done soon and fast enough before other substrates of the same batch are exposed. Also, already exposed substrates may be stripped and reworked—to improve yield—or discarded, thereby avoiding performing exposures on substrates that are known to be faulty. In a case where only some target portions of a substrate are faulty, further exposures can be performed only on those target portions which are acceptable.

An inspection apparatus may be used to determine the properties of the substrates, and in particular, how the properties of different substrates or different layers of the same substrate vary from layer to layer. The inspection apparatus may be integrated into a lithographic apparatus, such as lithographic apparatus 100 and/or 100', or lithocell 300, or may be a stand-alone device. To enable rapid measurements, it is desirable that the inspection apparatus measure properties in the exposed resist layer immediately after the exposure. However, the latent image in the resist has a very low contrast—there is only a very small difference in refractive index between the parts of the resist which have been exposed to radiation, and those which have not—and not all inspection apparatuses have sufficient sensitivity to make useful measurements of the latent image.

Therefore measurements may be taken after the post-exposure bake step (PEB) which is customarily the first step carried out on exposed substrates and increases the contrast between exposed and unexposed parts of the resist. At this stage, the image in the resist may be referred to as semi-latent. It is also possible to make measurements of the developed resist image—at which point either the exposed or unexposed parts of the resist have been removed—or after a pattern transfer step such as etching. The latter possibility limits the possibilities for rework of faulty substrates but may still provide useful information.

Figure 4:
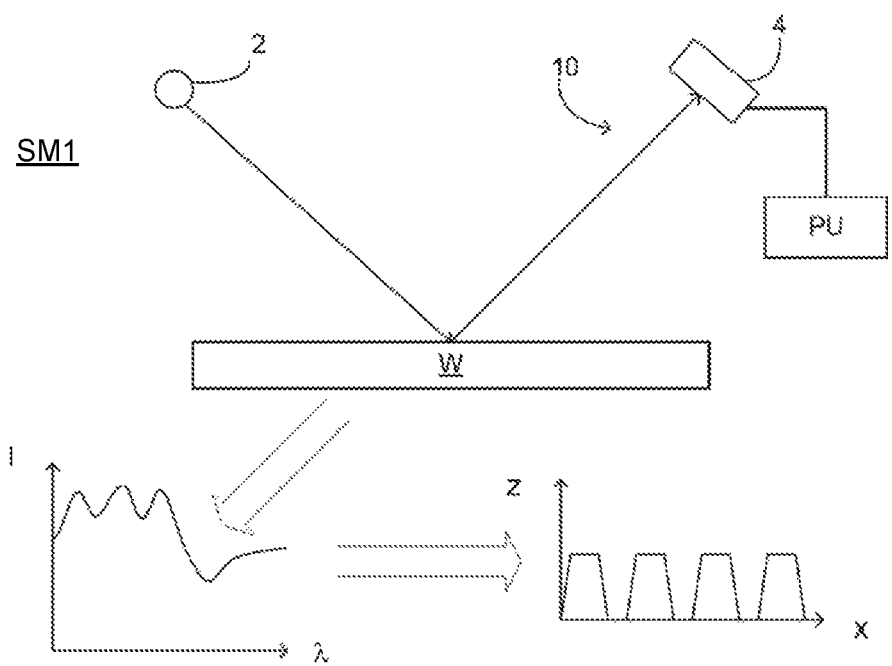
FIGS. 4 and 5 are schematic illustrations of scatterometers, according to various exemplary embodiments.

FIG. 4 depicts a scatterometer SM1 which may be used in the present invention. Scatterometer SM1 may be integrated into a lithographic apparatus, such as lithographic apparatus 100 and/or 100', or lithocell 300, or may be a stand-alone device. It comprises a broadband (white light) radiation projector 2 which projects radiation onto a substrate W. The reflected radiation is passed to a spectrometer detector 4, which measures a spectrum 10 (intensity as a function of wavelength) of the specular reflected radiation. From this data, the structure or profile giving rise to the detected spectrum may be reconstructed by a processing unit PU, for example, by Rigorous Coupled Wave Analysis and non-linear regression or by comparison with a library of simulated spectra as shown at the bottom of FIG. 4. In general, for the reconstruction, the general form of the structure is known, and some parameters are assumed from knowledge of the process by which the structure was made, leaving only a few parameters of the structure to be determined from the scatterometry data. Such a scatterometer may be configured as a normal-incidence scatterometer or an oblique-incidence scatterometer.

Figure 5:
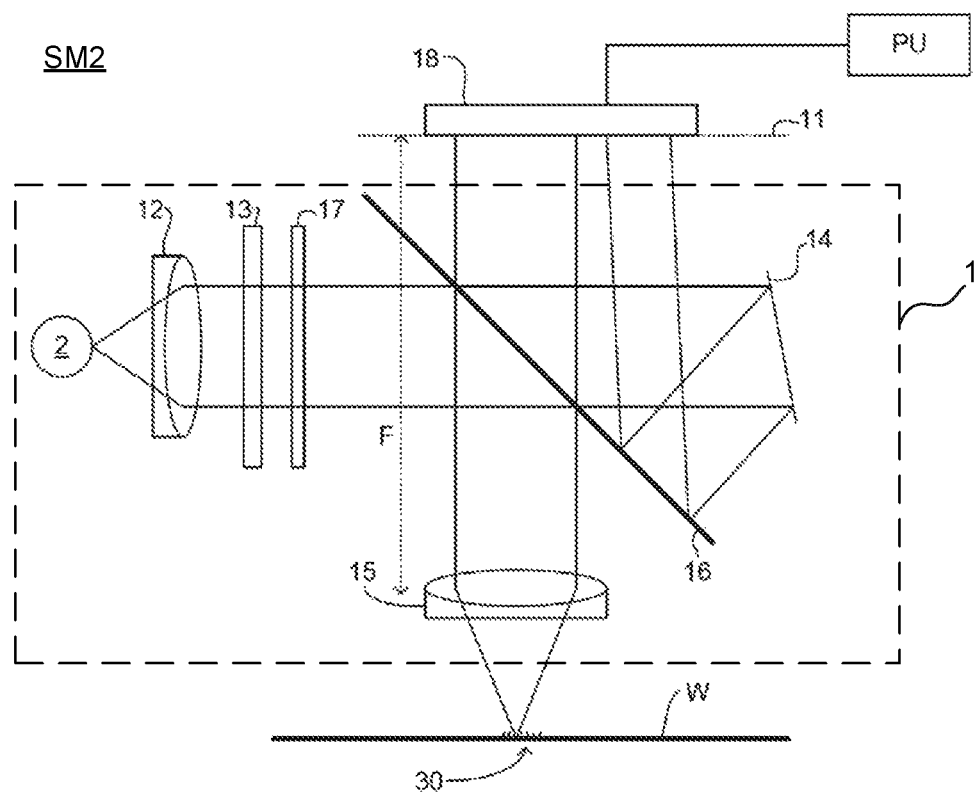

Another scatterometer SM2 that may be used with the present invention is shown in FIG. 5. Scatterometer SM2 may be integrated into a lithographic apparatus, such as lithographic apparatus 100 and/or 100', or lithocell 300, or may be a stand-alone device. Scatterometer SM2 may include an objective optical system 1 having a radiation source 2, a lens system 12, a filter 13 (e.g., interference filter), a reflecting device 14 (e.g., reference mirror), a lens system 15 (e.g., a microscopic objective lens system, also referred herein as objective lens system), a partially reflected surface 16 (e.g., a beam splitter), and a polarizer 17. Scatterometer SM2 may further include a detector 18 and a processing unit PU.

In one exemplary operation, the radiation emitted by radiation source 2 is collimated using lens system 12 and transmitted through interference filter 13 and polarizer 17, is reflected by partially reflected surface 16 and is focused onto substrate W via microscope objective lens system 15. The reflected radiation then transmits through partially reflecting surface 16 into a detector 18 in order to have the scatter spectrum detected. The detector may be located in the back-projected pupil plane 11, which is at the focal length F of the objective lens system 15, however the pupil plane may instead be re-imaged with auxiliary optics (not shown) onto the detector 18. The pupil plane is the plane in which the radial position of radiation defines the angle of incidence, and the angular position defines the azimuth angle of the radiation. In one example, the detector is a two-dimensional detector so that a two-dimensional angular scatter spectrum of a substrate target 30 can be measured. The detector 18 may be, for example, an array of CCD or CMOS sensors, and may use an integration time of, for example, 40 milliseconds per frame.

A reference beam may be used, for example, to measure the intensity of the incident radiation. To do this, when the radiation beam is incident on beam splitter 16 part of it is transmitted through the beam splitter as a reference beam towards reference mirror 14. The reference beam is then projected onto a different part of the same detector 18 or alternatively onto a different detector (not shown).

Interference filter 13 may include a set of interference filters, which may be available to select a wavelength of interest in the range of, for example, 405-790 nm, or a lower range, for example, 200-300 nm. The interference filter may be tunable rather than comprising a set of different filters. Alternatively, for example, a grating may be used instead of interference filters.

Detector 18 may measure the intensity of scattered light at a single wavelength (or narrow wavelength range), the intensity separately at multiple wavelengths or integrated over a wavelength range. Furthermore, detector 18 may separately measure the intensity of transverse magnetic- and transverse electric-polarized light and/or the phase difference between the transverse magnetic- and transverse electric-polarized light.

Using a broadband light source (i.e., one with a wide range of light frequencies or wavelengths—and, thus, of colors) for a radiation source 2 may give a large etendue, allowing the mixing of multiple wavelengths. The plurality of wavelengths in the broadband preferably may each have a bandwidth of $\Delta\lambda$ and a spacing of at least $2\Delta\lambda$ (i.e., twice the bandwidth). Several "sources" of radiation can be different portions of an extended radiation source which have been split using fiber bundles. In this way, angle resolved scatter spectra can be measured at multiple wavelengths in parallel. A 3-D spectrum (wavelength and two different angles) can be measured, which contains more information than a 2-D spectrum. This allows more information to be measured which increases metrology process robustness. This is described in more detail in EP 1628164 A2, which is incorporated by reference herein in its entirety.

The target 30 on substrate W may be a 1-D grating, which is printed such that after development, the bars are formed of solid resist lines. The target 30 may be a 2-D grating, which is printed such that, after development, the grating is formed of solid resist pillars or vias in the resist. The bars, pillars, or vias may alternatively be etched into the substrate. This pattern is sensitive to chromatic aberrations in the lithographic projection apparatus, particularly the projection system PL, and illumination symmetry. The presence of such aberrations will manifest themselves in a variation in the printed grating. Accordingly, the scatterometry data of the printed gratings is used to reconstruct the gratings. The parameters of the 1-D grating, such as line widths and shapes, or parameters of the 2-D grating, such as pillar or via widths or lengths or shapes, may be input to the reconstruction process, performed by processing unit PU, from knowledge of the printing step and/or other scatterometry processes.

As described above, the target can be on the surface of the substrate. This target will often take the shape of a series of lines in a grating or substantially rectangular structures in a 2-D array. The purpose of rigorous optical diffraction theories in metrology is effectively the calculation of a diffraction spectrum that is reflected from the target. In other words, target shape information is obtained for CD (critical dimension) uniformity and overlay metrology. Overlay metrology is a measuring system in which the overlay of two targets is measured in order to determine whether two layers on a substrate are aligned or not. CD uniformity is simply a measurement of the uniformity of the grating on the spectrum to determine how the exposure system of the lithographic apparatus is functioning. Specifically, CD, or critical dimension, is the width of the object that is "written" on the substrate and is the limit at which a lithographic apparatus is physically able to write on a substrate.

Diffraction-based overlay using "dark field" scatterometry blocks the zeroth order of diffraction (corresponding to a specular reflection), and processes only one or more higher orders of diffraction to create a gray scale image of the target. Diffraction-based overlay using this dark field technique enables overlay measurements on smaller targets, and is known as micro-diffraction-based overlay (μDBO). μDBO can require a very high contrast ratio.

Exemplary Optical Systems

A prism is a wedge shaped transparent optical element that separates electromagnetic (EM) radiation based on refraction due to a difference in refractive indices. Generally, a prism has a flat, polished surface. The cross-section of a prism is a polygon, and the sides of the prism are antiparallel. A prism can include a plurality of surfaces, and the angles between surfaces of a prism can vary, but there must be an angle between at least two surfaces. A beam-splitting prism is a type of reflective prism configured to split a beam into two or more beams. A polarizing prism is a type of prism configured to split a beam into varying polarization components based on non-linear optics.

Non-linear optics (NLO) involves EM radiation in non-linear media, meaning a polarization of the media (i.e., electric dipole moment) interacts non-linearly with the electric field of the EM radiation. The normal linear relationship between an electric field and the dielectric field breaks down in non-linear media. The non-linear interaction can manifest itself as a change in polarization, frequency, phase, and/or beam path.

A non-linear prismatic optic can have non-linear refractive index changes. For example, a birefringent material has a refractive index that depends on the polarization and propagation direction of the EM radiation. The birefringent non-linear media causes double refraction, wherein unpolarized EM radiation is split into two beam paths of parallel and perpendicular polarization. The birefringent non-linear media consists of two polarization wave components corresponding to different refractive indices. The ordinary ray (o-ray) has polarization in a direction perpendicular to the optical axis, while the extraordinary ray (e-ray), which does not follow Snell's law, has polarization in a direction of the optical axis of the medium.

A Wollaston prism is a non-linear prismatic optic that separates EM radiation by its polarization components. A Wollaston prism separates unpolarized EM radiation into beams that are polarized orthogonal to each other. Generally, Wollaston prisms include two right triangle prisms that are secured (e.g., glued, cemented, etc.) together on a face of each prism to form a cube. Outgoing beams of radiation from a Wollaston prism diverge based on the wedge angle and wavelength of the EM radiation and separate into two orthogonally polarized beams. Divergence angles, which are dependent upon the wedge angles, can range from about 1° to 45°.

Figure 6:
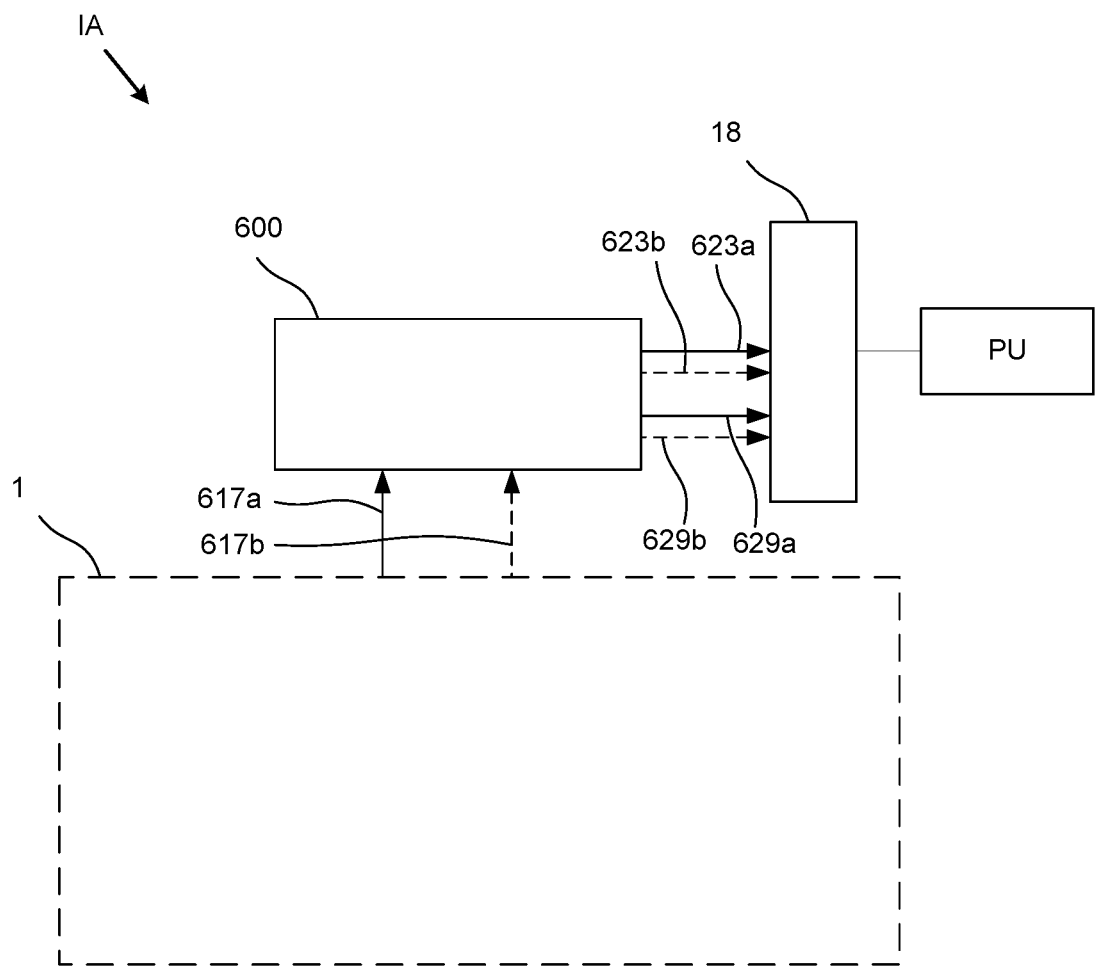
FIG. 6 is a schematic illustration of an optical system for an inspection apparatus, according to an exemplary embodiment.

FIG. 6 is a schematic illustration of an exemplary optical system 600 used in an exemplary inspection apparatus IA, according to some embodiments of this disclosure. Although optical system 600 is shown to be used with inspection apparatus IA, the embodiments of this disclosure are not limited to this example, and the optical system embodiments of this disclosure can be used with other optical systems, such as, but not limited to, lithographic apparatus 100 and/or 100', lithocell 300, scatterometer SM1, scatterometer SM2, and/or other optical systems.

For example, FIG. 6 illustrates objective optical system 1 of scatterometer SM2 of FIG. 5, detector 18 of scatterometer SM2 of FIG. 5, processing unit PU of scatterometer SM2 of FIG. 5, and optical system 600. According to some examples, optical system 600 is configured to receive a zeroth diffraction order beam 617a and a first diffraction order beam 617b reflected from a diffraction target, for example, substrate target 30 of substrate W of FIG. 5.

According to some embodiments, optical system 600 can be configured to generate first polarized zeroth order sub-beam 623a and second polarized zeroth order sub-beam 629a from zeroth diffraction order beam 617a. Additionally, optical system 600 can be configured to generate first polarized first order sub-beam 623b and second polarized first order sub-beam 629b from first diffraction order beam 617b. In some embodiments, detector 18 can receive sub-beams 623a, 623b, 629a, and 629b, and measure the intensity and/or polarization of sub-beams 623a, 623b, 629a, and 629b. Detector 18 and processing unit PU can be configured to measure one or more parameters of substrate W, substrate target 30, and/or optical systems (such as a lithographic apparatus) used to generate substrate W. In some embodiments, detector 18 and processing unit PU can be configured to measure a parameter of substrate target 30 on substrate W, for example, an overlay error between successive layers formed in or on the patterned substrate W and/or critical linewidth of developed photosensitive resist.

In some embodiments, first polarized zeroth order sub-beam 623a can be a linear horizontal (H) polarization component of zeroth diffraction order beam 617a, and second polarized zeroth order sub-beam 629a can be a linear vertical (V) polarization component of zeroth diffraction order beam 617a, orthogonal to linear horizontal (H) polarization component 623a. In some embodiments, first polarized first order sub-beam 623b can be a linear horizontal (H) polarization component of first diffraction order beam 617b, and second polarized first order sub-beam 629b can be a linear vertical (V) polarization component of first diffraction order beam 617b, orthogonal to linear horizontal (H) polarization component 623b.

According to some examples, zeroth diffraction order beam 617a and first diffraction order beam 617b can be unpolarized radiation beams. Optical system 600 can be configured to split these unpolarized input beams (617a and 617b) into their horizontal (H) and vertical (V) polarization components and output resulting sub-beams (623a and 629a) from input beam 617a and sub-beams (623b and 629b) from input beam 617b, each travelling, for example, parallel and adjacent to each other. Optical systems of the embodiments of this disclosure can be configured to image H, and V polarized beams onto a single detector (e.g., a sensor) 18 at a common focal plane. For example, detector 18 can be a single dark field detector that receives the H and V polarized beams. Polarized radiation with its electric field along the plane of incidence is deemed p-polarized (i.e., transverse-magnetic (TM)), and polarized radiation with its electric field normal to the plane of incidence is deemed s-polarized (i.e., transverse-electric (TE)). In one example, sub-beams 623a and 623b can have horizontal (H) polarization information and p-polarization orientation. And for example, sub-beams 629a and 629b can have vertical (V) polarization information and p-polarization orientation.

According to some exemplary embodiments, optical system 600 can also include one or more quarter-wave plates (QWPs) (not shown in FIG. 6) and/or one or more mirror surfaces (not shown in FIG. 6). The QWPs can include, for example, a QWP polymer stack or a QWP coating applied to a mirror surface. Alternatively, optical system 600 can be designed such that optical system 600 does not include any QWPs, according to some embodiments. In some examples, optical system 600 can be designed to use total internal reflection (TIR) within optical system 600 with or without a mirror surface.

Optical system 600 can be designed such that sub-beams 623a, 629a, 623b, and 629b travel the same or substantially the same optical paths through optical system 600, according to some exemplary embodiments. In the context of this invention, the term "substantially the same optical paths" means that the path difference is such that the sub-beams are focused at detector 18 within the depth of focus for images formed by the sub-beams after propagation through optical system 600. The depth of focus can be a function of, for example, radiation wavelength, sub-beam numerical aperture, and/or aberrations. In other words, optical system 600 can be designed such that the optical paths for sub-beams 623a, 629a, 623b, and 629b through optical system 600 have the same or substantially the same length, according to some exemplary embodiments. Additionally or alternatively, optical system 600 can be designed such that the output surface(s), the input surface, and/or other surfaces of optical system 600 are tilted relative to the optical path of sub-beams 623a, 629a, 623b, and 629b. These tilts can prevent or minimize "ghost" reflections off of these surfaces from overlapping with primary beams on a detector (such as detector 18), according to some examples.

In additional or alternative embodiments, one of the sub-beams 623a or 629a (and one of the sub-beams 623b or 629b) can transmit through or be reflected from an optical system 600 surface twice to achieve a predetermined polarization extinction ratio (PER). The polarization extinction ratio can be defined as the ratio of the transmission of the unwanted component to the wanted component. The polarization extinction ratio can be expressed as a linear ratio $$\left(\text{e.g., } \frac{T_2}{T_1}\right),$$

a percentage $$\left(\text{e.g., } \left(\frac{T_2}{T_1}\right) * 100\right),$$

or as a function in decibel (dB)

$$\left(\text{e.g., } 10 * \log\left(\frac{T_2}{T_1}\right)\right).$$

Here, T2 can be the transmittance (e.g., power) of the unwanted component (e.g., undesired polarization) and T1 can be the transmittance (e.g., power) of the wanted component (e.g., the desired polarization). The polarization extinction ratio is a property that depends on the wavelength of the radiation beam. As one example, an unpolarized radiation beam can be split into a sub-beam with p-polarization orientation and another sub-beam with s-polarization orientation. The p-polarized sub-beam can transmit through optical system 600 and the s-polarized sub-beam can reflect from optical system 600. The polarization extinction ratio for the s-polarized sub-beam can be defined as the ratio of the unwanted part of the radiation beam reflected by optical system 600 to the wanted s-polarized sub-beam reflected by optical system 600.

Figure 7:
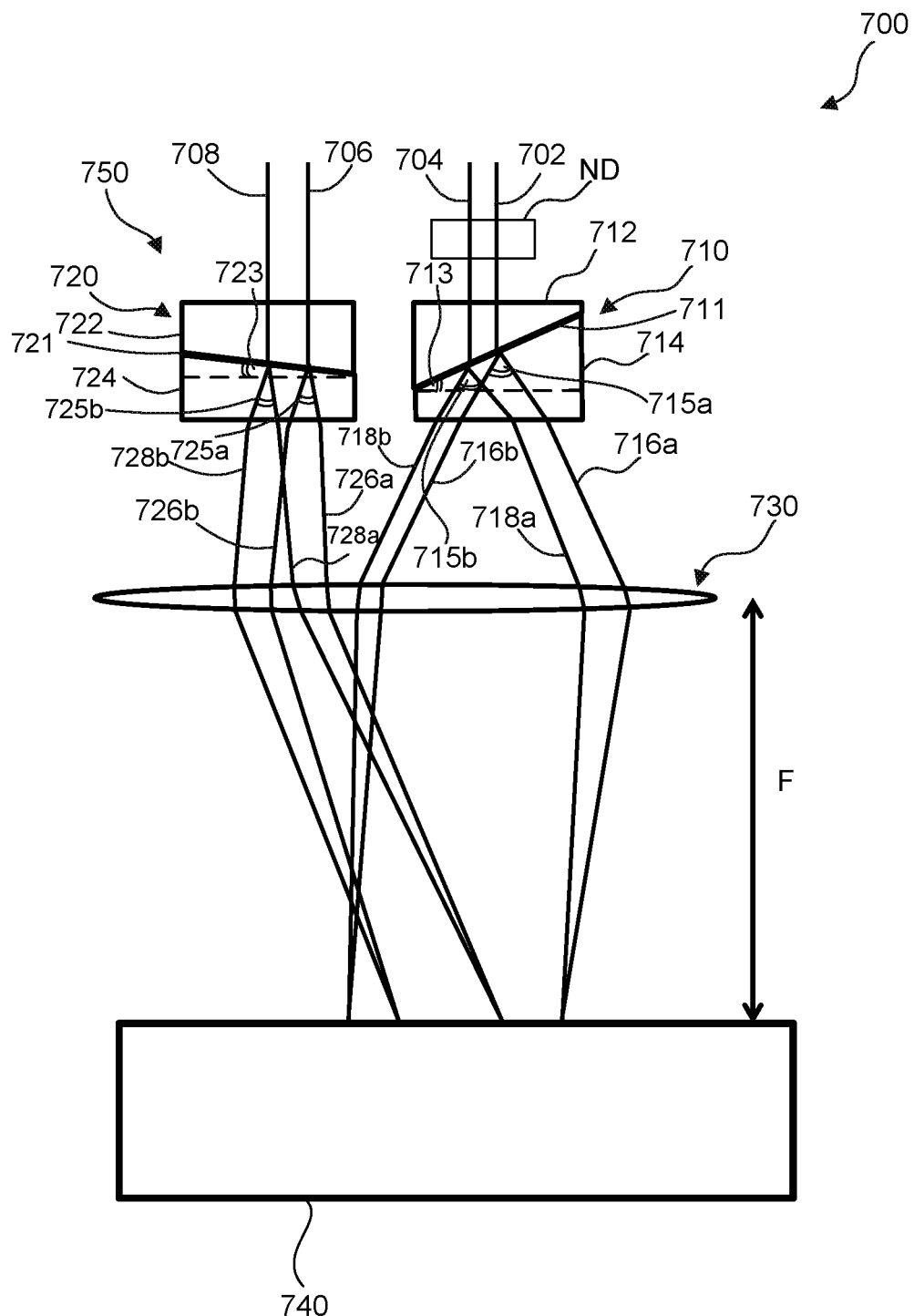
FIG. 7 is a schematic illustration of an exemplary optical system for an inspection apparatus, according to an exemplary embodiment.

FIG. 7 illustrates an exemplary optical system 750 used in an exemplary inspection apparatus 700, according to some embodiments. According to some embodiments, inspection apparatus, IA of FIG. 6 can include optical system 750 of FIG. 7. For example, optical system 600 of FIG. 6 can be optical system 750 of FIG. 7. As such, optical system 750 can receive zeroth, and first diffraction order beams 617a, 617b, as discussed above with respect to FIG. 6. However, optical system 750 can be located in any location of a lithographic apparatus, a metrology apparatus, etc.

As shown in FIG. 7, inspection apparatus 700 can include optical system 750, a lens system 730, and a detector 740. Inspection apparatus 700 can receives a first (−0) zeroth order sub-beam 702, a second (+0) zeroth order sub-beam 704, a first (−1) first order sub-beam 706, and a second (+1) first order sub-beam 708 reflected from, for example, a diffraction target such as substrate target 30 of FIG. 5. In some embodiments, sub-beams 702, 704, 706, and 708 are generated and isolated by dipole or quadrupole illumination radiation poles (not shown). For example, sub-beams 702, 704, 706, and 708 can be generated and isolated by using only two opposite illumination quadrants, sometimes referred to as BMW illumination, such that the remaining two quadrants are not used in the illumination but are configured to capture first (−1) first order sub-beam 706 and second (+1) first order sub-beam 708. In some embodiments, radiation poles (not shown) in opposite quadrants of the illumination system, for example, including radiation source 2 of FIG. 5, can generate and isolate sub-beams 702, 704, 706, and 708. Further, in some embodiments, astigmatism aberration may be reduced by blocking zeroth order beams associated with radiation poles in opposite quadrants. This illumination technique is described in more detail in U.S. Pat. No. 7,511,799 B2, issued Mar. 31, 2009, and U.S. Pat. No. 8,830,447 B2, issued Sep. 9, 2014, which are each incorporated by reference herein in their entirety.

Optical system 750 can include first non-linear prismatic optic 710 and second non-linear prismatic optic 720. In other examples (not shown), optical system 750 can include more than two non-linear prismatic optics.

For example, first and second non-linear prismatic optics 710, 720 can each be a Wollaston prism as shown in FIG. 7. For example, first non-linear prismatic optic 710 can include first and second right triangle orthogonal prisms 712, 714, and second non-linear prismatic optic 720 can include first and second right triangle orthogonal prisms 722, 724. First and second right triangle orthogonal prisms 712, 714 can form, for example, a first unitary cube, such as a first Wollaston prism. And first and second right triangle orthogonal prisms 722, 724 can form a second unitary cube, such as a second Wollaston prism.

Optical system 750 is configured to separate/generate two polarization components of at least two different diffraction orders. For example, first non-linear prismatic optic 710 can receive first (−0) and second (+0) zeroth order input sub-beams 702, 704, and generate/separate (a) first and second polarized first (−0) zeroth order output sub-beams 716a, 716b and (b) first and second polarized second (+0) zeroth order output sub-beams 718a, 718b. In some embodiments, output sub-beams 716a and 718a can be linear horizontal (H) polarization components of input sub-beams 702 and 704, respectively. And output sub-beams 716b and 718b can be linear vertical (V) polarization components, orthogonal to linear horizontal (H) polarization components 716a, 718a, of input sub-beams 702 and 704. For example, second non-linear prismatic optic 720 receives first (−1) and second (+1) first order input sub-beams 706, 708, and generate/separate (a) first and second polarized first (−1) first order output sub-beams 726a, 726b and (b) first and second polarized second (+1) first order output sub-beams 728a, 728b. In some embodiments, output sub-beams 726a and 728a can be linear horizontal (H) polarization components of input sub-beams 706 and 708, respectively. And output sub-beams 726b and 728b can be linear vertical (V) polarization components, orthogonal to linear horizontal (H) polarization components 726a, 728a, of input sub-beams 706 and 708, respectively.

In some embodiments, first non-linear prismatic optic 710 and second non-linear prismatic optic 720 are configured differently—first non-linear prismatic optic 710 and second non-linear prismatic optic 720 are different types of non-linear prismatic optics. For example, triangular prisms 712, 714 of first non-linear prismatic optic 710 are secured (e.g., glued, cemented, bonded, etc.) at wedge connection 711, which forms wedge angle 713 between wedge connection 711 and a horizontal cross-section parallel to a base of first non-linear prismatic optic 710. Divergence angles 715a and 715b for output sub-beams 716a, 716b and 718a, 718b, respectively, depend upon wedge angle 713. For example, triangular prisms 722, 724 of second non-linear prismatic optic 720 are secured (e.g., glued, cemented, bonded, etc.) at wedge connection 721, which forms wedge angle 723 between wedge connection 721 and a horizontal cross-section parallel to a base of second non-linear prismatic optic 720. Divergence angles 725a and 725b for output sub-beams 726a, 726b and 728a, 728b, respectively, depend upon wedge angle 723. In some embodiments, wedge angle 713 can form divergence angles 715a, 715b that are greater than wedge angle 721 and corresponding divergence angles 725a, 725b formed by second non-linear prismatic optic 720. In some embodiments, wedge angle 713 (and divergence angles 715a, 715b) of first non-linear prismatic optic 710 can be, for example, about 45°, such that output sub-beams 716a and 716b (and output sub-beams 718a and 718b) are separated/diverged by about 45° upon exiting first non-linear prismatic optic 710. In some embodiments, wedge angle 721 (and divergence angles 725a, 725b) of second non-linear prismatic optic 720 can be, for example, about 15°, such that output sub-beams 726a and 726b (and output sub-beams 728a and 728b) are separated/diverged by 15° upon exiting second non-linear prismatic optic 720. In some embodiments, first non-linear prismatic optic 710 can be thicker than second non-linear prismatic optic 720, such that input sub-beams 702, 704 travel a longer path through first non-linear prismatic optic 710. For example, intensities of input sub-beams 702, 704 can be reduced by the longer path from absorbing and/or scattering of input sub-beams 702, 704 in first non-linear prismatic optic 710. In some embodiments, second non-linear prismatic optic 720 can be thicker than first non-linear prismatic optic 710, such that input sub-beams 706, 708 travel a longer path through second non-linear prismatic optic 720.

Inspection apparatus 700 also includes lens system 730. Lens system 730 is disposed between optical system 750 and detector 740. For example, lens system 730 can be placed at focal length F in order to focus exiting sub-beams 716a, 716b, 718a, 718b, 726a, 726b, 728a, and 728b onto detector 740. In some embodiments, lens system 730 can arrange sub-beams 716a, 716b, 718a, 718b, 726a, 726b, 728a, and 728b into a pre-arranged pattern on detector 740. In some embodiments, optical system 750 is at the pupil plane of inspection apparatus 700. The pupil plane is the plane in which the radial position of radiation defines the angle of incidence, and the angular position defines the azimuth angle of the radiation. Although lens system 730 is illustrated a single optical element, lens system 730 can be composed of two or more optical elements. In some embodiments, lens system 730 can be omitted from inspection apparatus 700.

Inspection apparatus 700 also includes detector 740. Detector 740 can detect and/or sense energy (e.g., photons, EM radiation) impinging upon a surface of detector 740. For example, detector 740 can include a photoactive region where photo-generation (e.g., electron-hole pairs) and/or transfer of photons to electrons occurs, and detector 740 can measure a movement of electrical charge created by the impinging energy. In some embodiments, detector 740 can be a single detector to image sub-beams 716a, 716b, 718a, 718b, 726a, 726b, 728a, and 728b. For example, detector 740 can be a single dark field or phase contrast detector (e.g., CCD, CMOS, etc.), in which the unscattered illumination beam, for example, radiation source 2 of FIG. 5, is excluded or blocked from beams entering optical system 750. In some embodiments, detector 740 can be a quadrant detector with four individual photosensitive areas for detection of energy.

Inspection apparatus 700 or optical system 750 can include one or more neutral density filters ND. Neutral density filter ND is an optical filter that reduces or modifies (e.g., by partial reflection) the intensity of impinging radiation equally. In some embodiments, as shown in FIG. 7, neutral density filter ND can be disposed between incoming first (−0) and second (+0) zeroth order sub-beams and first non-linear prismatic optic 710. The neutral density filter ND is configured to reduce the intensity of zeroth order diffraction beams 702, 704, which can have a higher intensity than first order diffraction beams 706, 708, to normalize the intensities of all zeroth and first order sub-beams 716a, 716b, 718a, 718b, 726a, 726b, 728a, and 728b impinging on detector 740. For example, neutral density filter ND can normalize intensities of first (−0) and second (+0) zeroth order sub-beams 702, 704 relative to intensities of first (−1) and second (+1) first order sub-beams 706, 708. In some embodiments, inspection apparatus 700 or optical system 750 can omit neutral density filter ND. Alternatively, in some embodiments, neutral density filter ND can be omitted, and first non-linear prismatic optic 710 can be configured to be thicker in size than second non-linear prismatic optic 720. For example, a thickness of first non-linear prismatic optic 710 can be designed to normalize intensities of first (−0) and second (+0) zeroth order sub-beams 702, 704 relative to intensities of first (−1) and second (+1) first order sub-beams 706, 708.

Figure 8:
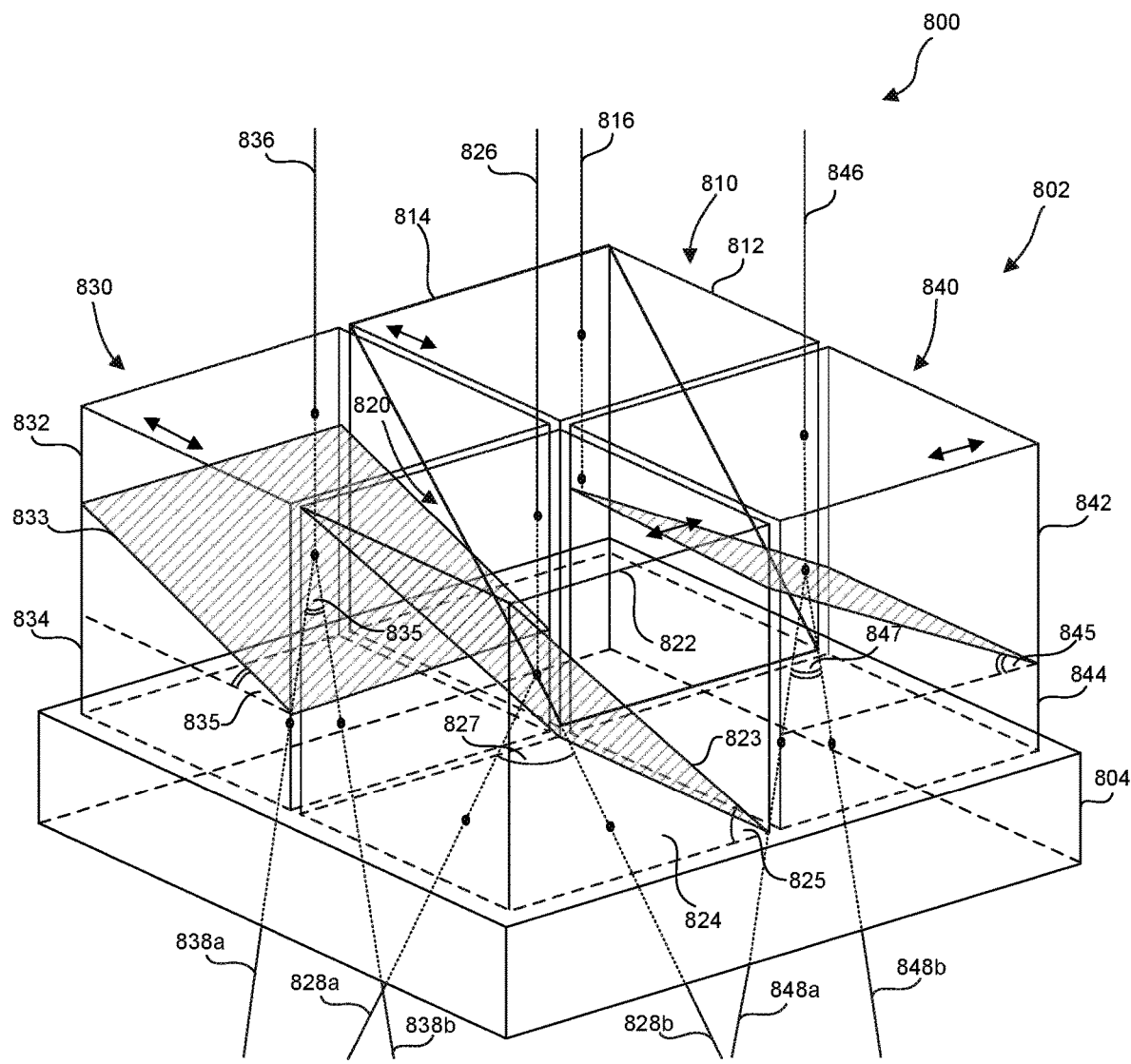
FIG. 8 is a schematic illustration of an optical system, according to an exemplary embodiment.

FIG. 8 illustrates an exemplary optical system 800, according to some embodiments. According to some examples, optical system 800 includes a 2×2 matrix array 802 of non-linear prismatic optics 810, 820, 830, and 840. In some embodiments, as shown in FIG. 8, 2×2 matrix array 802 of non-linear prismatic optics 810, 820, 830, and 840 is disposed on a transparent plate 804. Transparent plate 804 maintains the positional relationship between non-linear prismatic optics 810, 820, 830, and 840. In some embodiments, plate 804 is omitted, and the 2×2 matrix array 802 is disposed in an optical frame or cage (not shown) configured to secure non-linear prismatic optics 810, 820, 830, and 840 in positions relative to one another.

According to some embodiments, inspection apparatus 700 of FIG. 7 can include optical system 800 of FIG. 8. For example, optical system 750 of FIG. 7 can be optical system 800 of FIG. 8. Optical system 800 can be located near detector 4 of FIG. 4, and/or detector 18 of FIG. 5 and/or FIG. 6, and/or detector 740 of FIG. 7. Optical system 800 can be configured to receive the zeroth and first diffraction order beams 617a, 617b, as discussed above with respect to FIG. 6, or the zeroth and first order sub-beams 702, 704, 706, and 708, as discussed above with respect to FIG. 7. However, optical system 800 can be located in any location of a lithographic apparatus, a metrology apparatus, etc. Although FIG. 8, illustrates a 2×2 matrix array, optical system 800 can include arrays of different sizes.

Optical system 800 can include first non-linear prismatic optic 810, second non-linear prismatic optic 820, third non-linear prismatic optic 830, and/or fourth non-linear prismatic optic 840. For example, non-linear prismatic optics 810, 820, 830, and 840 can each be Wollaston prisms. Alternatively, in some embodiments, non-linear prismatic optics 810, 820, 830, and 840 can each be a birefringent optical element, a Nomarski prism, a Senarmont prism, a Rochon prism, a Glan-Thompson prism, and/or a Glan-Foucault prism. Alternatively, in some embodiments, non-linear prismatic optics 810, 820, 830, and/or 840 can be a birefringent optical element, a Wollaston prism, a Nomarski prism, a Senarmont prism, a Rochon prism, a Glan-Thompson prism, and/or a Glan-Foucault prism. In some embodiments, transparent plate 804 can be a transparent glass orthotope. Again, in some embodiments, transparent plate 804 can be omitted.

In some embodiments, first non-linear prismatic optic 810 includes first and second right triangle orthogonal prisms 812, 814. For example, as shown in FIG. 8, first and second right triangle orthogonal prisms 812, 814 of first non-linear prismatic optic 810 are secured (e.g., glued, cemented, bonded, etc.) at wedge connection (not shown), which forms wedge angle (not shown) between wedge connection (not shown) and a horizontal cross-section parallel to a base of first non-linear prismatic optic 810. Divergence angle (not shown) for output sub-beams (not shown) depends upon wedge angle (not shown). In some embodiments, wedge angle (not shown) and corresponding divergence angle (not shown) of first non-linear prismatic optic 810 can range from about 1° to 45°. For example, first and second right triangle orthogonal prisms 812, 814 can form a cube with a wedge angle (not shown) of 45°.

In some embodiments, first non-linear prismatic optic 810 can be first Wollaston prism 810 of a first type, configured to have a wedge angle (not shown) and divergence angle (not shown) greater than wedge angle 835 and/or wedge angle 845 of third non-linear prismatic optic 830 and fourth non-linear prismatic optic 840, respectively, for example, a wedge angle of 45°. First non-linear prismatic optic 810 receives first (−0) zeroth order sub-beam 816 and separates/generates first and second polarized first (−0) zeroth order sub-beams (not shown). In some embodiments, for example, sub-beam (not shown) can be a linear horizontal (H) polarization component, and sub-beam (not shown) can be a linear vertical (V) polarization component, orthogonal to linear horizontal (H) polarization component, of first (−0) zeroth order sub-beam 816. In some embodiments, as shown in FIG. 8, first right triangle orthogonal prism 812 has an optical axis in a vertical (V) direction, indicated by a vertical arrow, in order to separate/generate a linear vertical (V) polarization component (not shown) of input sub-beam 816, and second right triangle orthogonal prism 814 has an optical axis in a horizontal (H) direction in order to separate/generate a linear horizontal (H) polarization component (not shown) of input sub-beam 816.

Second non-linear prismatic optic 820 is similar to first non-linear prismatic optic 810. In some embodiments, second non-linear prismatic optic 820 includes first and second right triangle orthogonal prisms 822, 824. For example, as shown in FIG. 8, first and second right triangle orthogonal prisms 822, 824 of second non-linear prismatic optic 820 are secured (e.g., glued, cemented, bonded, etc.) at wedge connection 823, which forms wedge angle 825 between wedge connection 823 and a horizontal cross-section parallel to a base of second non-linear prismatic optic 820. Divergence angle 827 for output sub-beams 828a, 828b depends upon wedge angle 825. In some embodiments, wedge angle 825 and corresponding divergence angle 827 of second non-linear prismatic optic 820 can range from about 1° to 45°. For example, first and second right triangle orthogonal prisms 822, 824 can form a cube with a wedge angle 825 of 45°.

In some embodiments, second non-linear prismatic optic 820 can be second Wollaston prism 820 of a first type, configured to have a wedge angle 825 and divergence angle 827 greater than wedge angle 835 and/or wedge angle 845 of third non-linear prismatic optic 830 and fourth non-linear prismatic optic 840, respectively, for example, a wedge angle 825 of 45°. Second non-linear prismatic optic 820 receives second (+0) zeroth order sub-beam 826 and separates/generates first and second polarized second (+0) zeroth order sub-beams 828a, 828b. In some embodiments, for example, sub-beam 828a can be a linear horizontal (H) polarization component and sub-beam 828b can be a linear vertical (V) polarization component, orthogonal to linear horizontal (H) polarization component 828a, of second (+0) zeroth order sub-beam 826. In some embodiments, as shown in FIG. 8, first and second non-linear prismatic optics 810, 820 are rotated 90° about the optical axis with respect to each other. In some embodiments, as shown in FIG. 8, first right triangle orthogonal prism 822 has an optical axis in a horizontal (H) direction, indicated by a horizontal arrow, in order to separate/generate a linear horizontal (H) polarization component 828a of input sub-beam 826, and second right triangle orthogonal prism 824 has an optical axis in a vertical (V) direction in order to separate/generate a linear vertical (V) polarization component 828b of input sub-beam 826.

In some embodiments, third non-linear prismatic optic 830 includes first and second orthogonal prisms 832, 834. For example, as shown in FIG. 8, first and second orthogonal prisms 832, 834 of third non-linear prismatic optic 830 are secured (e.g., glued, cemented, bonded, etc.) at wedge connection 833, which forms wedge angle 835 between wedge connection 833 and a horizontal cross-section parallel to a base of third non-linear prismatic optic 830. Divergence angle 837 for output sub-beams 838a, 838b depends upon wedge angle 835. In some embodiments, wedge angle 835 and corresponding divergence angle 837 of second non-linear prismatic optic 830 can range from about 1° to 45°. For example, first and second right triangle orthogonal prisms 832, 834 can form a cube with a wedge angle 835 of 15°.

In some embodiments, third non-linear prismatic optic 830 can be third Wollaston prism 830 of a second type, configured to have a wedge angle 835 and divergence angle 837 less than wedge angle (not shown) and/or wedge angle 825 of first non-linear prismatic optic 810 and second non-linear prismatic optic 820, respectively, for example, a wedge angle 835 of 15°. Third non-linear prismatic optic 830 receives first (−1) first order sub-beam 836 and separates/generates first and second polarized first (−1) first order sub-beams 838a, 838b. In some embodiments, for example, sub-beam 838a can be a linear horizontal (H) polarization component, and sub-beam 838b can be a linear vertical (V) polarization component, orthogonal to linear horizontal (H) polarization component 818a, of first (−1) first order sub-beam 836. In some embodiments, as shown in FIG. 8, first right triangle orthogonal prism 832 has an optical axis in a vertical (V) direction, indicated by a vertical arrow, in order to separate/generate a linear vertical (V) polarization component 838b of input sub-beam 836, and second right triangle orthogonal prism 834 has an optical axis in a horizontal (H) direction in order to separate/generate a linear horizontal (H) polarization component 838a of input sub-beam 836.

Fourth non-linear prismatic optic 840 is similar to third non-linear prismatic optic 830. In some embodiments, fourth non-linear prismatic optic 840 includes first and second orthogonal prisms 842, 844. For example, as shown in FIG. 8, first and second orthogonal prisms 842, 844 of fourth non-linear prismatic optic 840 are secured (e.g., glued, cemented, bonded, etc.) at wedge connection 843, which forms wedge angle 845 between wedge connection 843 and a horizontal cross-section parallel to a base of fourth non-linear prismatic optic 840. Divergence angle 847 for output sub-beams 848a, 848b depends upon wedge angle 845. In some embodiments, wedge angle 845 and corresponding divergence angle 847 of fourth non-linear prismatic optic 840 can range from about 1° to 45°. For example, first and second right triangle orthogonal prisms 842, 844 can form a cube with a wedge angle 845 of 15°.

In some embodiments, fourth non-linear prismatic optic 840 can be fourth Wollaston prism 840 of a second type, configured to have a wedge angle 845 and divergence angle 847 less than wedge angle (not shown) and/or wedge angle 825 of first non-linear prismatic optic 810 and second non-linear prismatic optic 820, respectively, for example, a wedge angle 845 of 15°. Fourth non-linear prismatic optic 840 receives second (+1) first order sub-beam 846 and separates/generates first and second polarized second (+1) first order sub-beams 848a, 848b. In some embodiments, for example, sub-beam 848a can be a linear horizontal (H) polarization component, and sub-beam 848b can be a linear vertical (V) polarization component, orthogonal to linear horizontal (H) polarization component 848a, of second (+1) first order sub-beam 846. In some embodiments, as shown in FIG. 8, third and fourth non-linear prismatic optics 830, 840 are rotated 90° about the optical axis with respect to each other. In some embodiments, as shown in FIG. 8, first right triangle orthogonal prism 842 has an optical axis in a horizontal (H) direction, indicated by a horizontal arrow, in order to separate/generate a linear horizontal (H) polarization component 848a of input sub-beam 846, and second right triangle orthogonal prism 844 has an optical axis in a vertical (V) direction in order to separate/generate a linear vertical (V) polarization component 848b of input sub-beam 846.

Figure 9:
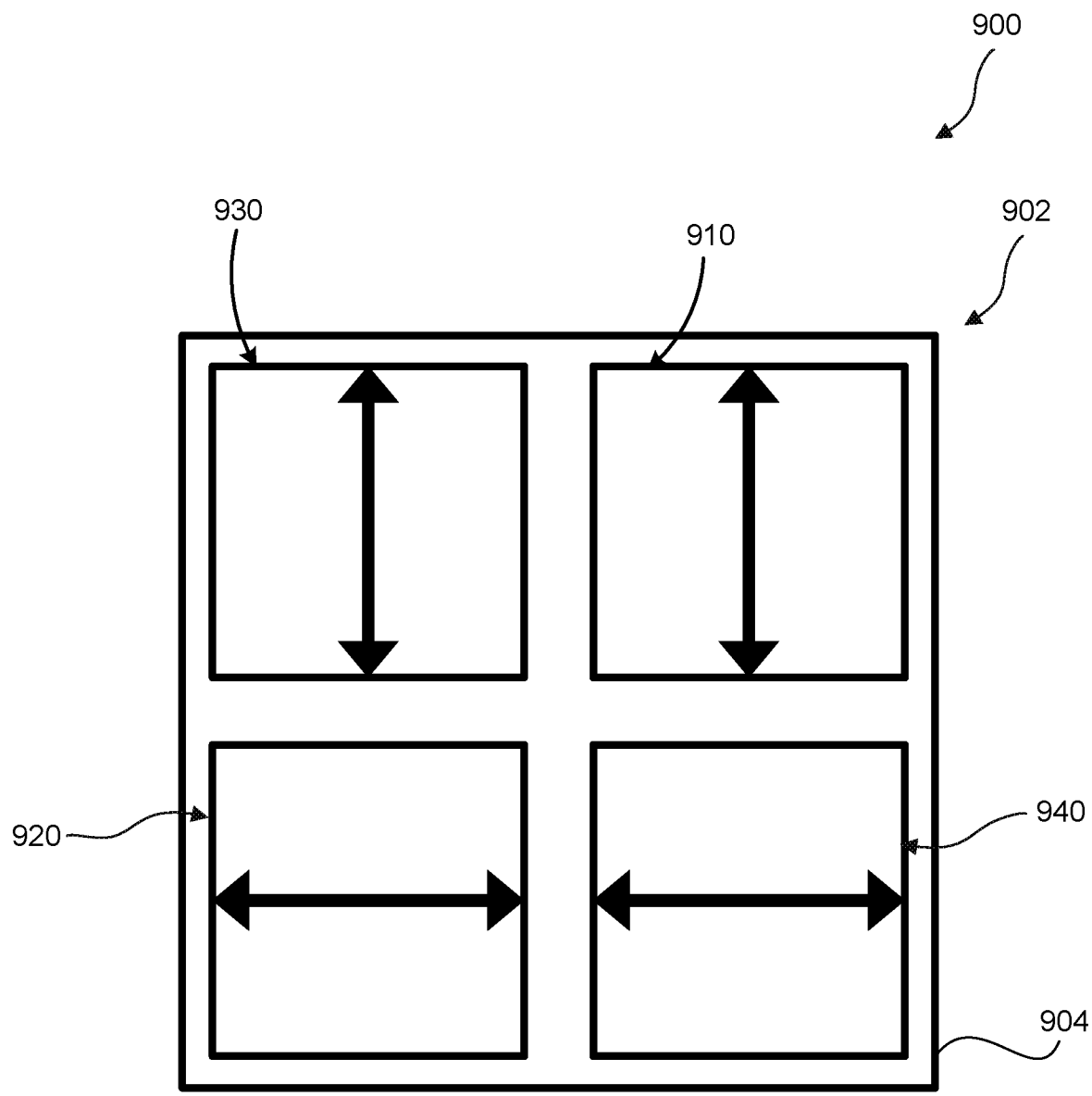
FIG. 9 is a schematic illustration of an optical system, according to an exemplary embodiment.

FIG. 9 schematically illustrates an exemplary optical system 900, according to some embodiments. According to some examples, optical system 900 is a 2×2 matrix array 902 of four Wollaston prisms 910, 920, 930, and 940 disposed (e.g., secured) on a transparent plate 904. Optical system 900 is similar to optical system 800 of FIG. 8, and FIG. 9 is a top view of optical system 900.

Optical system 900 includes first Wollaston prism 910, second Wollaston prism 920, third Wollaston prism 930, and fourth Wollaston prism 940. In some embodiments, first and second Wollaston prisms 910, 920 are a first type. For example, first and second Wollaston prisms 910, 920 can each have wedge angles (and divergence angles) that range from about 20° to 45°. For example, first and second Wollaston prisms 910, 920 can each have wedge angles (and divergence angles) that range from about 40° to 45°. In some embodiments, third and fourth Wollaston prisms 930, 940 are a second type. For example, third and fourth Wollaston prisms 930, 940 can each have wedge angles (and divergence angles) that range from about 1° to 25°. For example, third and fourth Wollaston prisms 930, 940 can each have wedge angles (and divergence angles) that range from about 10° to 15. In some embodiments, as shown in FIG. 9, first and second Wollaston prisms 910, 920 are rotated 90° about the optical axis with respect to each other, and third and fourth Wollaston prisms 930, 940 are rotated 90° about the optical axis with respect to each other.

Figure 10:
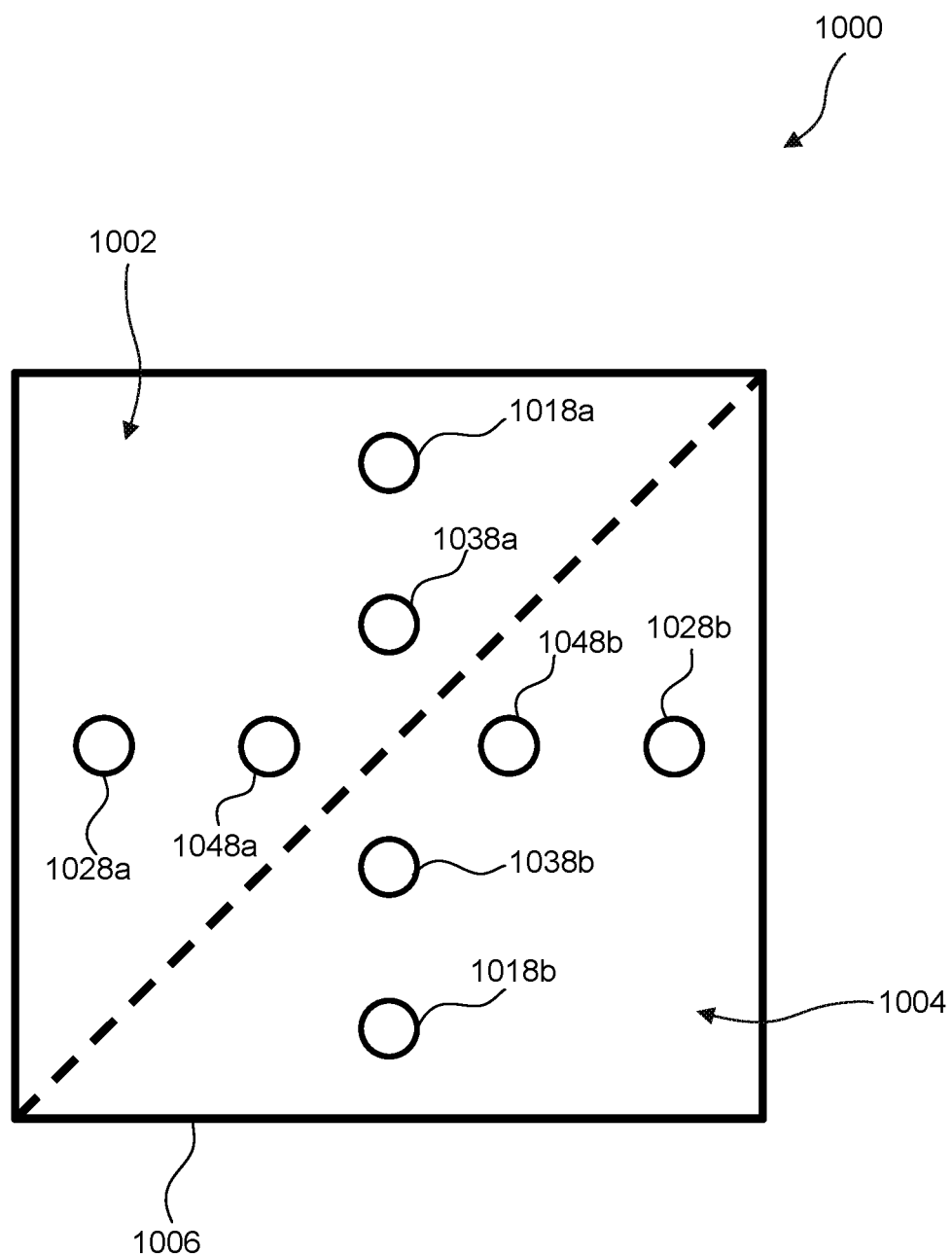
FIG. 10 is a schematic illustration of an optical system, according to an exemplary embodiment.

FIG. 10 illustrates an exemplary optical system 1000, according to some embodiments of this disclosure. According to some embodiments, inspection apparatus 700 of FIG. 7 can include optical system 800 of FIG. 8 or optical system 900 of FIG. 9. For example, optical system 750 of FIG. 7 can be optical system 800 of FIG. 8 or optical system 900 of FIG. 9. Optical system 800 or optical system 900 can be located near detector 4 of FIG. 4, and/or detector 18 of FIG. 5 and/or FIG. 6, and/or detector 740 of FIG. 7, and can be configured to receive the zeroth and first diffraction order beams 617a, 617b, as discussed above with respect to FIG. 6, the zeroth and first order sub-beams 702, 704, 706, and 708, as discussed above with respect to FIG. 7, or the zeroth and first order sub-beams 816, 826, 836, and 846, as discussed above with respect to FIG. 8. According to some embodiments, optical system 750, optical system 800, or optical system, 900 can include optical system 1000 of FIG. 10.

As shown in FIG. 10, optical system 1000 includes a horizontal (H) polarization component 1002 and a vertical (V) polarization component 1004 that are separated into an upper diagonal region 1002 and a lower diagonal region 1004, respectively, on detector 1006. Detector 1006 can be similar to detector 4 of FIG. 4, detector 18 of FIG. 5 and/or FIG. 6, and detector 740 of FIG. 7. Similar to optical system 750 of FIG. 7, optical system 800 of FIG. 8, and optical system 900 of FIG. 9, detector 1006 receives and images first and second polarized first (−0) zeroth order sub-beams 1018a, 1018b, first and second polarized second (+0) zeroth order sub-beams 1028a, 1028b, first and second polarized first (−1) first order sub-beams 1038a, 1038b, and first and second polarized second (+1) first order sub-beams 1048a, 1048b. In some embodiments, as shown in FIG. 10, sub-beams 1018a, 1028a, 1038a, and 1048a can be a linear horizontal (H) polarization component and sub-beams 1018b, 1028b, 1038b, and 1048b can be a linear vertical (V) polarization component, orthogonal to linear horizontal (H) polarization component.

In some embodiments, as shown in FIG. 10, zeroth order sub-beams 1018a, 1018b, 1028a, and 1028b are arranged in an outer ring on detector 1006 due to a large dispersion angle (e.g., wedge angle of 45°) in optical system 1000, for example, from first and second Wollaston prisms 910, 920 of a first type in FIG. 9. In some embodiments, as shown in FIG. 10, first order sub-beams 1038a, 1038b, 1048a, and 1048b are arranged in an inner ring on detector 1006 due to a small dispersion angle (e.g., wedge angle of 15°) in optical system 1000, for example, from third and fourth Wollaston prisms 930, 940 of a second type in FIG. 9.

In some embodiments, detector 1006 simultaneously detects zeroth and first diffraction orders and first and second polarizations of each diffraction order 1018a, 1018b, 1028a, 1028b, 1038a, 1038b, 1048a, and 1048b. For example, as shown in FIG. 10, detector 1006 images sub-beams 1018a, 1018b, 1028a, 1028b, 1038a, 1038b, 1048a, and 1048b as eight discrete beam spots. In some embodiments, detector 1006 is a single dark field detector.

In some embodiments, after detection of zeroth and first diffraction orders and first and second polarizations of each diffraction order, a parameter of interest of a diffraction target, for example substrate target 30 of FIG. 5, is adjusted and/or optimized based on detected first and second polarizations of one or more diffraction orders, for example 1018a, 1018b, 1028a, 1028b, 1038a, 1038b, 1048a, and/or 1048b of FIG. 10, to improve accuracy, precision, timing, efficiency, signal-to-noise ratio (S/N), and/or productivity in a metrology system, a lithography system, a scatterometer, an inspection apparatus, and/or a lithographic cell. For example, the parameter of interest can be an overlay error between successive layers formed in or on the diffraction target and/or critical linewidth of developed photosensitive resist. The overlay error between successive layers can be adjusted (e.g., minimized) based on the individual first and second polarizations (e.g., H and V for second (+1) first order sub-beams 1048a, 1048b, respectively) and/or the cross-polarizations of first and second polarizations (e.g., measure amount of first polarized (H) second (+1) first order sub-beam 1048a in second polarized (V) second (+1) first order sub-beam 1048b). Additionally or alternatively, for example, the parameter of interest for a 1-D grating can be a line width and/or a shape. Additionally or alternatively, for example, the parameter of interest for a 2-D grating can be a pillar, a via width or length, and/or shapes. In some embodiments, the parameter of interest can be an operational parameter of a lithographic apparatus, which can be adjusted to improve accuracy, precision, timing, efficiency, signal-to-noise ratio (S/N), and/or productivity in the lithographic apparatus. For example, an operational parameter can be overlay error. For example, an operational parameter can be overlay error represented by translation, magnification, rotation, polarization, and/or wafer coordinates.

In some embodiments, after detection of zeroth and first diffraction orders and first and second polarizations of each diffraction order, a parameter of a lithographic apparatus, for example lithographic apparatus 100 or 100', is adjusted and/or optimized based on detected first and second polarizations of one or more diffraction orders, for example, 1018a, 1018b, 1028a, 1028b, 1038a, 1038b, 1048a, and/or 1048b of FIG. 10, to improve accuracy, precision, timing, efficiency, signal-to-noise ratio (S/N), and/or productivity in the lithographic apparatus. For example, the parameter of the lithographic apparatus can be an overlay error between successive layers formed in or on a patterned substrate and/or critical linewidth of developed photosensitive resist. Additionally or alternatively, for example, the parameter of the lithographic apparatus can be a recipe step for processing further substrates. Additionally or alternatively, for example, one or more steps of a manufacturing process, lithography process, and/or metrology process can be controlled in accordance with detected first and second polarizations of one or more diffraction orders (e.g., 1018a, 1018b, 1028a, 1028b, 1038a, 1038b, 1048a, and/or 1048b of FIG. 10).

In some embodiments, first and second polarizations of one or more diffraction orders can be investigated by detector 18 and/or processing unit PU. In some embodiments, cross-polarization of horizontal (H) and vertical (V) polarization components can be investigated. For example, an amount of how much a horizontal (H) polarization component has leaked into a vertical (V) polarization component for one or more diffraction orders, and vice-versa, can be measured. In some embodiments, for some diffraction targets, the strength or intensity of each polarization (H or V) can be investigated. For example, an amount of horizontal (H) polarization may be greater than vertical (V) polarization for some targets (e.g., horizontal line shapes), and the cross-polarization (e.g., how much H has leaked into V) can be compared to determine better accuracy and/or precision of a parameter of interest for a particular target, substrate, and/or lithographic apparatus.

In some embodiments, optical systems of the embodiments of this disclosure can be configured to separate the H and V polarizations of an unpolarized beam and image both H and V polarized beams onto a single detector (e.g., a dark field sensor) at a common focal plane (e.g., the pupil plane). Additionally or alternatively, the optical systems of the embodiments of this disclosure can minimize chromatic aberration (e.g., lateral chromatic aberration) by making the optical system, with one or more non-linear prismatic optics, function as a flat plate in both H and V polarization beam paths.

The embodiments may further be described using the following clauses:

1. An inspection apparatus comprising:
   an optical system comprising a non-linear prismatic optic, and configured to receive zeroth and first diffraction order beams reflected from a diffraction target and separate first and second polarizations of each diffraction order beam; and
   a detector configured to simultaneously detect first and second polarizations of each of the zeroth and first diffraction order beams.

2. The inspection apparatus of clause 1, wherein the optical system is at a pupil plane of the inspection apparatus.

3. The inspection apparatus of clause 1, wherein the non-linear prismatic optic is birefringent and configured to separate ordinary and extraordinary rays from each of the zeroth and first diffraction order beams.

4. The inspection apparatus of clause 1, wherein:
   the first polarization of each of the zeroth and first diffraction order beams is a horizontal polarization component, and
   the second polarization of each of the zeroth and first diffraction order beams is a vertical polarization component, orthogonal to the horizontal polarization component.

5. The inspection apparatus of clause 1, wherein the optical system further comprises a plurality of non-linear prismatic optics.

6. The inspection apparatus of clause 5, wherein the plurality of non-linear prismatic optics comprises a plurality of Wollaston prisms.

7. The inspection apparatus of clause 6, wherein the plurality of Wollaston prisms comprise:
   two first-type Wollaston prisms each having a first wedge angle and corresponding first divergence angle, the two first-type Wollaston prisms being rotated 90° with respect to each other; and
   two second-type Wollaston prisms each having a second polarization wedge angle and corresponding second divergence angle, wherein the first wedge angle and first divergence angle are greater than the second wedge angle and second divergence angle, the two second-type Wollaston prisms being rotated 90° with respect to each other.

8. A lithographic apparatus for measuring micro-diffraction-based overlay, comprising:
   a first illumination optical system configured to illuminate a diffraction pattern;
   a projection optical system configured to project an image of the diffraction pattern onto a substrate; and
   a scatterometer configured to determine a parameter of the lithographic apparatus, the scatterometer comprising:
      a second illumination optical system configured to deliver at least one beam of radiation;
      an objective optical system configured to focus the at least one beam of radiation onto the substrate; and
      an inspection apparatus configured to detect a reflected radiation beam from the substrate, comprising:
         an optical system comprising a non-linear prismatic optic, and configured to receive zeroth and first diffraction order beams reflected from the diffraction target and separate first and second polarizations of each diffraction order beam; and
         a detector configured to simultaneously detect first and second polarizations of each of the zeroth and first diffraction order beams.

9. The lithographic apparatus of clause 8, wherein the non-linear prismatic optic is selected from the group consisting of a birefringent optical element, a Wollaston prism, a Nomarski prism, a Sénarmont prism, a Rochon prism, a Glan-Thompson prism, and a Glan-Foucault prism.

10. The lithographic apparatus of clause 8, wherein the optical system includes a neutral density filter configured to normalize an intensity of a zeroth diffraction order relative to an intensity of a first diffraction order.

11. The lithographic apparatus of clause 8, wherein the optical system is at a pupil plane of the inspection apparatus, and the detector is a single dark field detector.

12. The lithographic apparatus of clause 8, wherein:
   the first polarization of each of the zeroth and first diffraction order beams is a horizontal polarization component, and
   the second polarization of each of the zeroth and first diffraction order beams is a vertical polarization component, orthogonal to the horizontal polarization component.

13. The lithographic apparatus of clause 8, wherein the optical system further comprises a plurality of non-linear prismatic optics.

14. The lithographic apparatus of clause 13, wherein the plurality of non-linear prismatic optics comprises a plurality of Wollaston prisms.

15. The lithographic apparatus of clause 14, wherein the plurality of Wollaston prisms comprise:
   two first-type Wollaston prisms each having a first wedge angle and corresponding first divergence angle, the two first-type Wollaston prisms being rotated 90° with respect to each other; and
   two second-type Wollaston prisms each having a second polarization wedge angle and corresponding second divergence angle, wherein the first wedge angle and first divergence angle are greater than the second wedge angle and second divergence angle, the two second-type Wollaston prisms being rotated 90° with respect to each other.

16. The lithographic apparatus of clause 14, wherein the plurality of Wollaston prisms are arranged on a transparent plate in a 2×2 matrix array, and are configured to separately receive first and second zeroth diffraction order sub-beams and first and second first diffraction order sub-beams.

17. The lithographic apparatus of clause 16, wherein a horizontal polarization component and a vertical polarization component, orthogonal to the horizontal polarization component, are separated for each of the first and second zeroth diffraction order sub-beams and the first and second first diffraction order sub-beams by the corresponding plurality of Wollaston prisms, and imaged by the detector as eight discrete beam spots.

18. A method for measuring micro-diffraction-based overlay, comprising:
   separating, by an optical system comprising a non-linear prismatic optic, first and second polarizations of both zeroth and first diffraction order beams reflected from a diffraction target;
   detecting simultaneously, by a detector, zeroth and first diffraction orders and first and second polarizations of each diffraction order; and
   adjusting an operational parameter of a lithographic apparatus based on the detected first and second polarizations of one or more diffraction orders to improve accuracy or precision in the lithographic apparatus.

19. The method of clause 18, further comprising:
   separating individually first and second zeroth diffraction order sub-beams and first and second first diffraction order sub-beams; and
   isolating a horizontal polarization component and a vertical polarization component, orthogonal to the horizontal polarization component, for each of the first and second zeroth diffraction order sub-beams and first and second first diffraction order sub-beams.

20. The method of clause 19, further comprising imaging the horizontal and vertical polarization components of each zeroth and first diffraction order sub-beams on a single dark field detector as eight discrete beam spots.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, LCDs, thin-film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track unit (a tool that typically applies a layer of resist to a substrate and develops the exposed resist), a metrology unit and/or an inspection unit. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

Although specific reference may have been made above to the use of embodiments of the invention in the context of optical lithography, it will be appreciated that the invention may be used in other applications, for example, imprint lithography, and where the context allows, is not limited to optical lithography. In imprint lithography, a topography in a patterning device defines the pattern created on a substrate. The topography of the patterning device may be pressed into a layer of resist supplied to the substrate whereupon the resist is cured by applying electromagnetic radiation, heat, pressure or a combination thereof. The patterning device is moved out of the resist leaving a pattern in it after the resist is cured.

It is to be understood that the phraseology or terminology herein is for the purpose of description and not of limitation, such that the terminology or phraseology of the present specification is to be interpreted by those skilled in relevant art(s) in light of the teachings herein.

The term "substrate" as used herein describes a material onto which material layers are added. In some embodiments, the substrate itself may be patterned and materials added on top of it may also be patterned or may remain without patterning.

Embodiments of the invention may be implemented in hardware, firmware, software, or any combination thereof. Embodiments of the invention may also be implemented as instructions stored on a machine-readable medium, which may be read and executed by one or more processors. A machine-readable medium may include any mechanism for storing or transmitting information in a form readable by a machine (e.g., a computing device). For example, a machine-readable medium may include read only memory (ROM); random access memory (RAM); magnetic disk storage media; optical storage media; flash memory devices; electrical, optical, acoustical, or other forms of propagated signals, and others. Further, firmware, software, routines, and/or instructions may be described herein as performing certain actions. However, it should be appreciated that such descriptions are merely for convenience and that such actions, in fact, result from computing devices, processors, controllers, or other devices executing the firmware, software, routines, and/or instructions.

The following examples are illustrative, but not limiting, of the embodiments of this disclosure. Other suitable modifications and adaptations of the variety of conditions and parameters normally encountered in the field, and which would be apparent to those skilled in the relevant art(s), are within the spirit and scope of the disclosure.

Although specific reference may be made in this text to the use of the apparatus and/or system according to the invention in the manufacture of ICs, it should be explicitly understood that such an apparatus and/or system has many other possible applications. For example, it can be employed in the manufacture of integrated optical systems, guidance and detection patterns for magnetic domain memories, LCD panels, thin-film magnetic heads, etc. The skilled artisan will appreciate that, in the context of such alternative applications, any use of the terms "reticle," "wafer," or "die" in this text should be considered as being replaced by the more general terms "mask," "substrate," and "target portion," respectively.

While specific embodiments of the invention have been described above, it will be appreciated that the invention may be practiced otherwise than as described. The description is not intended to limit the invention.

It is to be appreciated that the Detailed Description section, and not the Summary and Abstract sections, is intended to be used to interpret the claims. The Summary and Abstract sections may set forth one or more but not all exemplary embodiments of the present invention as contemplated by the inventor(s), and thus, are not intended to limit the present invention and the appended claims in any way.

The present invention has been described above with the aid of functional building blocks illustrating the implementation of specified functions and relationships thereof. The boundaries of these functional building blocks have been arbitrarily defined herein for the convenience of the description. Alternate boundaries can be defined so long as the specified functions and relationships thereof are appropriately performed.

The foregoing description of the specific embodiments will so fully reveal the general nature of the invention that others can, by applying knowledge within the skill of the art, readily modify and/or adapt for various applications such specific embodiments, without undue experimentation, without departing from the general concept of the present invention. Therefore, such adaptations and modifications are intended to be within the meaning and range of equivalents of the disclosed embodiments, based on the teaching and guidance presented herein.

The breadth and scope of the present invention should not be limited by any of the above-described exemplary embodiments but should be defined only in accordance with the following claims and their equivalents.

The invention claimed is:

1. An inspection apparatus comprising:
    an optical system comprising a plurality of non-linear prismatic optics, and configured to receive zeroth and first diffraction order beams reflected from a diffraction target and separate first and second polarizations of each diffraction order beam; and
    a detector configured to simultaneously detect the first and second polarizations of each of the zeroth and first diffraction order beams,
    wherein the plurality of non-linear prismatic optics are configured to separately receive the zeroth and first diffraction order beams.

2. The inspection apparatus of claim 1, wherein the optical system is at a pupil plane of the inspection apparatus.

3. The inspection apparatus of claim 1, wherein the plurality of non-linear prismatic optics are birefringent and configured to separate ordinary and extraordinary rays from each of the zeroth and first diffraction order beams.

4. The inspection apparatus of claim 1, wherein:
    the first polarization of each of the zeroth and first diffraction order beams is a horizontal polarization component, and
    the second polarization of each of the zeroth and first diffraction order beams is a vertical polarization component, orthogonal to the horizontal polarization component.

5. The inspection apparatus of claim 1, wherein the plurality of non-linear prismatic optics comprises a plurality of Wollaston prisms.

6. The inspection apparatus of claim 5, wherein the plurality of Wollaston prisms comprise:
    two first-type Wollaston prisms each having a first wedge angle and a corresponding first divergence angle, the two first-type Wollaston prisms being rotated 90° with respect to each other; and
    two second-type Wollaston prisms each having a second wedge angle and a corresponding second divergence angle, wherein the first wedge angle and first divergence angle are greater than the second wedge angle and second divergence angle, the two second-type Wollaston prisms being rotated 90° with respect to each other.

7. A lithographic apparatus for measuring micro-diffraction-based overlay, comprising:
    a first illumination optical system configured to illuminate a diffraction pattern;
    a projection optical system configured to project an image of the diffraction pattern onto a substrate; and a scatterometer configured to determine a parameter of the lithographic apparatus, the scatterometer comprising:
  a second illumination optical system configured to deliver at least one beam of radiation;
  an objective optical system configured to focus the at least one beam of radiation onto the substrate; and
  an inspection apparatus configured to detect a reflected radiation beam from the substrate, the inspection apparatus comprising:
    an optical system comprising a plurality of non-linear prismatic optics, and configured to receive zeroth and first diffraction order beams reflected from the diffraction target and separate first and second polarizations of each diffraction order beam; and
    a detector configured to simultaneously detect the first and second polarizations of each of the zeroth and first diffraction order beams,
    wherein the plurality of non-linear prismatic optics are configured to separately receive the zeroth and first diffraction order beams.

8. The lithographic apparatus of claim 7, wherein the plurality of non-linear prismatic optics are selected from the group consisting of a birefringent optical element, a Wollaston prism, a Nomarski prism, a Sénarmont prism, a Rochon prism, a Glan-Thompson prism, and a Glan-Foucault prism.

9. The lithographic apparatus of claim 7, wherein the optical system includes a neutral density filter configured to normalize an intensity of a zeroth diffraction order relative to an intensity of a first diffraction order.

10. The lithographic apparatus of claim 7, wherein the optical system is at a pupil plane of the inspection apparatus, and the detector is a single dark field detector.

11. The lithographic apparatus of claim 7, wherein:
  the first polarization of each of the zeroth and first diffraction order beams is a horizontal polarization component, and
  the second polarization of each of the zeroth and first diffraction order beams is a vertical polarization component, orthogonal to the horizontal polarization component.

12. The lithographic apparatus of claim 7, wherein the plurality of non-linear prismatic optics comprises a plurality of Wollaston prisms.

13. The lithographic apparatus of claim 12, wherein the plurality of Wollaston prisms comprise:
  two first-type Wollaston prisms each having a first wedge angle and a corresponding first divergence angle, the two first-type Wollaston prisms being rotated 90° with respect to each other; and
  two second-type Wollaston prisms each having a second wedge angle and a corresponding second divergence angle, wherein the first wedge angle and first divergence angle are greater than the second wedge angle and second divergence angle, the two second-type Wollaston prisms being rotated 90° with respect to each other.

14. The lithographic apparatus of claim 12, wherein the plurality of Wollaston prisms are arranged on a transparent plate in a 2×2 matrix array, and are configured to separately receive first and second zeroth diffraction order sub-beams and first and second first diffraction order sub-beams.

15. The lithographic apparatus of claim 14, wherein a horizontal polarization component and a vertical polarization component, orthogonal to the horizontal polarization component, are separated for each of the first and second zeroth diffraction order sub-beams and the first and second first diffraction order sub-beams by the corresponding plurality of Wollaston prisms, and imaged by the detector as eight discrete beam spots.

16. A method for measuring micro-diffraction-based overlay, comprising:
  separating, by an optical system comprising a plurality of non-linear prismatic optics, first and second polarizations of both zeroth and first diffraction order beams reflected from a diffraction target;
  detecting simultaneously, by a detector, the zeroth and first diffraction orders and the first and second polarizations of each diffraction order; and
  adjusting an operational parameter of a lithographic apparatus based on the detected first and second polarizations of one or more diffraction orders to improve accuracy or precision in the lithographic apparatus,
  wherein the plurality of non-linear prismatic optics are configured to separately receive the zeroth and first diffraction order beams.

17. The method of claim 16, further comprising:
  separating individually first and second zeroth diffraction order sub-beams and first and second first diffraction order sub-beams; and
  isolating a horizontal polarization component and a vertical polarization component, orthogonal to the horizontal polarization component, for each of the first and second zeroth diffraction order sub-beams and first and second first diffraction order sub-beams.

18. The method of claim 17, further comprising imaging the horizontal and vertical polarization components of each zeroth and first diffraction order sub-beams on a single dark field detector as eight discrete beam spots.

* * * * *